US012784851B2

(12) United States Patent
Guo

(10) Patent No.: US 12,784,851 B2
(45) Date of Patent: Nov. 3, 2026

(54) ADVANCED DUMMY WORD LINE RAMP DOWN AFTER PROGRAM VERIFY FOR MEMORY DEVICES

(71) Applicant: Sandisk Technologies, Inc., Milpitas, CA (US)

(72) Inventor: Jiacen Guo, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 119 days.

(21) Appl. No.: 18/983,530

(22) Filed: Dec. 17, 2024

(65) Prior Publication Data

US 2026/0171176 A1 Jun. 18, 2026
US 2026/0311778 A1 Oct. 8, 2026

(51) Int. Cl.
*G11C 16/34* (2006.01)
*G11C 16/08* (2006.01)
*G11C 16/32* (2006.01)

(52) U.S. Cl.
CPC .......... *G11C 16/3459* (2013.01); *G11C 16/08* (2013.01); *G11C 16/32* (2013.01)

(58) Field of Classification Search
CPC ..... G11C 16/3459; G11C 16/08; G11C 16/32; G11C 16/28
See application file for complete search history.

(56) References Cited

U.S. PATENT DOCUMENTS 10,276,248 B1 4/2019 Lu et al.
10,541,037 B2 1/2020 Zhao et al.
10,553,298 B1 2/2020 Zhao et al.
11,972,820 B2 4/2024 Guo et al.
2024/0055059 A1 * 2/2024 Guo .................. G11C 16/0483
2024/0112743 A1 4/2024 Zhang et al.

* cited by examiner

*Primary Examiner* — Han Yang
(74) *Attorney, Agent, or Firm* — Dickinson Wright PLLC

(57) ABSTRACT

The present disclosure provides for pre-charging a memory device. The memory device comprises memory cells connected to data word lines and in a plurality of channels. The word lines comprise first data word lines and second data word lines separated by dummy word lines. Examples include performing a program-verify operation to verify programming of one or more memory cells connected to a selected data word line of the first data word lines by applying an overdrive voltage to the second data word lines and the dummy word lines. Examples include, during the program-verify operation, pre-charging a channel of memory cells connected to unselected data word line of the first data word lines by applying a pre-charge voltage to a source line, and ramping down the overdrive voltage applied to the dummy word lines prior to ramping down the overdrive voltage.

20 Claims, 23 Drawing Sheets

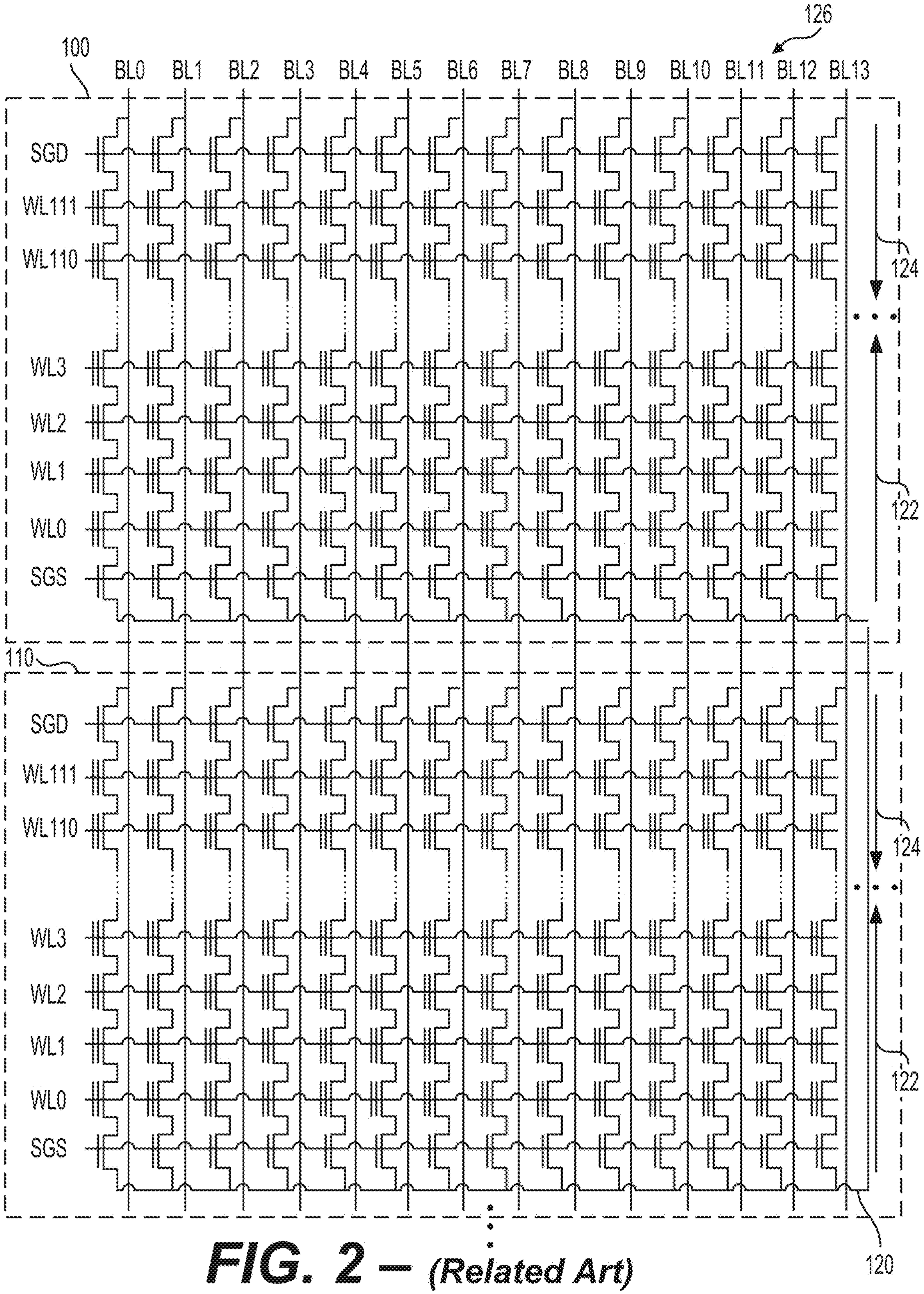
FIG. 2 — *(Related Art)*

(Related Art}

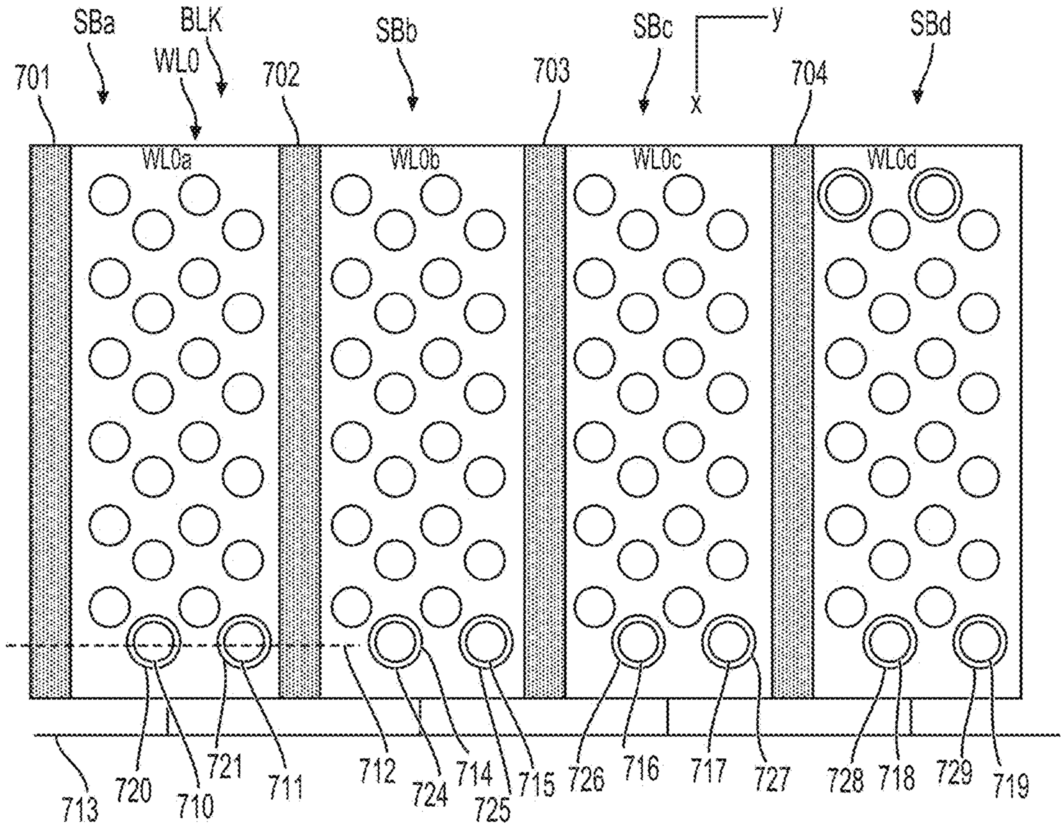
FIG. 7A – (Related Art)
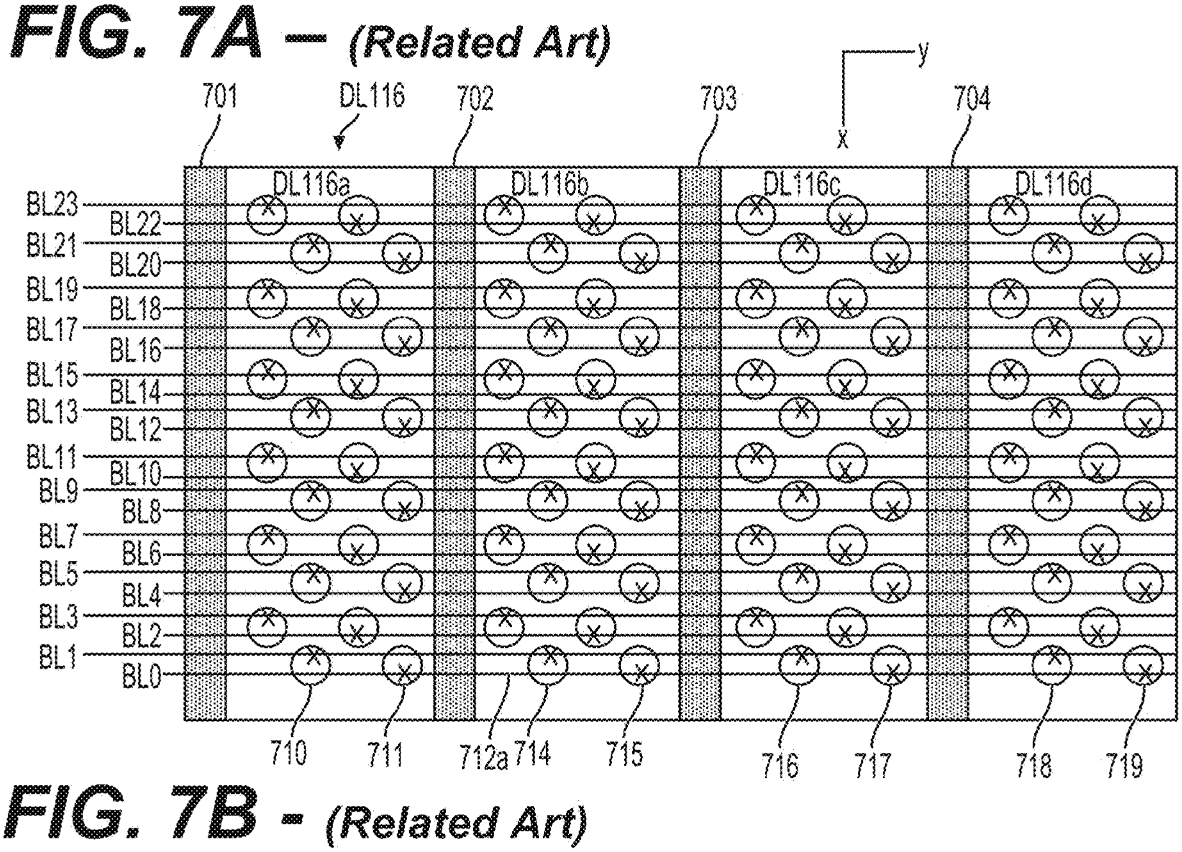
FIG. 7B - (Related Art)

ADVANCED DUMMY WORD LINE RAMP DOWN AFTER PROGRAM VERIFY FOR MEMORY DEVICES

BACKGROUND

1. Field

The present disclosure is related generally to the operation of NAND memory devices and, more particularly, to techniques of pre-charging a plurality of channels in a memory that include ramping down one or more dummy word lines after program verify.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. Programming the memory cells of a word line to retain data typically occurs in a plurality of program loops, each of which includes the application of a programming pulse to a control gate of the word line and, optionally, a verify operation to sense the threshold voltages of the memory cells being programmed. Each program loop may also include a pre-charge operation prior to the programming pulse to pre-charge a plurality of channels containing memory cells to be programmed.

SUMMARY

An aspect of the present disclosure is related to a method of pre-charging a memory device. The method includes the step of preparing a memory block that includes a plurality of memory cells that are connected to a plurality of data word lines and in a plurality of channels. The plurality of word lines comprises a first set of data word lines and a second set of data word lines separated by one or more dummy word lines. The method also includes the step of performing a program-verify operation to verify programming of one or more memory cells connected to a selected data word line of the first set of data word lines. Performing the program-verify operation includes a step of applying an overdrive voltage to the second set of data word lines and the one or more dummy word lines. The method further includes, during the program-verify operation, pre-charging a channel of memory cells connected to unselected data word line of the first set of data word lines. Pre-charging the channel includes the steps of applying a pre-charge voltage to a source line of the memory block, and ramping down the overdrive voltage applied to the one or more dummy word lines to a resting voltage prior to ramping down the overdrive voltage applied to the second set of data word lines to the resting voltage.

According to another aspect of the present disclosure, performing the program-verify operation further includes the steps of applying a verify compare voltage to the first set of data word lines, and verifying the programming of one or more memory cells connected to a selected data word line based on the verify compare voltage.

According to yet another aspect of the present disclosure, pre-charging the channel further includes the steps of ramping down the verify compare voltage applied to the selected data word line to the resting voltage before ramping down the overdrive voltages applied to the one or more dummy word lines.

According to still another aspect of the present disclosure, pre-charging the channel includes further the steps of ramping down a voltage applied to a source side selected gate (SGS) line from a source-side select gate voltage (Vsg) to an intermediate voltage. The Vsg is selected to turn on a transistor for the SGS, and wherein the intermediate voltage is greater than threshold voltages of the transistors connected to SGS.

According to yet another aspect of the present disclosure, the voltage applied to a source side selected gate (SGS) line is ramped down over a time period between applying the pre-charge voltage to the source line of the memory block and ramping down the overdrive voltage applied to the second set of data word lines to the resting voltage.

According to still another aspect of the present disclosure, the method further includes the step of after pre-charging the channel, applying one or more of a boosting voltage to the unselected data word lines of the first set of data word lines or a programming voltage to the selected data word line.

According to a further aspect of the present disclosure, the overdrive voltage applied to the one or more dummy word lines is ramped down after the pre-charge voltage is applied to the source line.

According to yet a further aspect of the present disclosure, the second set of data word lines is on a source side of the one or more dummy words adjacent to the source line.

According to still a further aspect of the present disclosure, the first set of data word lines is on a drain side of the one or more dummy words opposite the source line.

Another aspect of the present disclosure is related to a memory device. The memory device includes a memory block that includes a plurality of memory cells that are arranged in a plurality of word lines and in a plurality of channels. The plurality of word lines comprises a first set of data word lines and a second set of data word lines separated by one or more dummy word lines. The memory block also includes circuitry that is configured to conduct a program-verify operation to verify programming of one or more memory cells connected to a selected data word line of the first set of data word lines. The program-verify operation includes applying an overdrive voltage to the second set of data word lines and the one or more dummy word lines, and pre-charging a channel of memory cells connected to unselected data word line of the first set of data word lines. The pre-charging a channel of memory cells includes applying a pre-charge voltage to a source line of the memory block, and ramping down the overdrive voltage applied to the one or more dummy word lines to a resting voltage prior to ramping down the overdrive voltage applied to the second set of data word lines to the resting voltage.

According to another aspect of the present disclosure, performing the program-verify operation includes applying a verify compare voltage to the first set of data word lines, and verifying the programming of one or more memory cells connected to a selected data word line based on the verify compare voltage.

According to yet another aspect of the present disclosure, pre-charging the channel includes applying a verify compare voltage to the first set of data word lines, and verifying the programming of one or more memory cells connected to a selected data word line based on the verify compare voltage.

According to still another aspect of the present disclosure, pre-charging the channel further includes ramping down the verify compare voltage applied to the selected data word line to the resting voltage before ramping down the overdrive voltages applied to the one or more dummy word lines.

According to a further aspect of the present disclosure, the circuitry is further configured to, after pre-charging the channel, apply one or more of a boosting voltage to the unselected data word lines of the first set of data word lines or a programming voltage to the selected data word line.

According to yet a further aspect of the present disclosure, the overdrive voltage applied to the one or more dummy word lines is ramped down after the pre-charge voltage is applied to the source line.

According to still a further aspect of the present disclosure, the second set of data word lines is on a source side of the one or more dummy words adjacent to the source line, and wherein the first set of data word lines is on a drain side of the one or more dummy words opposite the source line.

Yet another aspect of the present disclosure is related to an apparatus. The apparatus includes a memory block that includes a plurality of memory cells that are arranged in a plurality of word lines and in a plurality of channels. The plurality of word lines comprises a first set of data word lines and a second set of data word lines separated by one or more dummy word lines. The apparatus also includes a controller that is configured to program one or more memory cells connected to a selected word line of the first set of word lines in a programming operation. The programming operation includes, in a program-verify operation, applying an overdrive voltage to the second set of data word lines and the one or more dummy word lines, applying a pre-charge voltage to a source line of the memory block, and lowering the overdrive voltage applied to the one or more dummy word lines to a resting voltage prior to ramping down the overdrive voltage applied to the second set of data word lines to the resting voltage. The apparatus further includes, after the program-verify operation, applying one or more of a boosting voltage to unselected data word lines of the first set of data word lines or a programming voltage to the selected word line.

According to another aspect of the present disclosure, the programming operation further includes, in the program-verify operation, verifying programming of the one or more memory cells connected to a selected data word line based on a verify compare voltage applied to the first set of data word lines.

According to yet another aspect of the present disclosure, the pre-charge voltage is applied to the source line after applying the verify compare voltage to the first set of data word lines and after applying the overdrive voltage to the second set of data word lines and the one or more dummy word lines.

According to still another aspect of the present disclosure, the programming operation further includes, in the program-verify operation, ramping down the verify compare voltage applied to the selected data word line to the resting voltage before ramping down the overdrive voltages applied to the one or more dummy word lines.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 2 depicts blocks of memory cells in an example two-dimensional configuration of the memory array of FIG. 1A;

FIG. 7A depicts a top view of an example word line layer WL0 of the stack of FIG. 6B;

FIG. 7B depicts a top view of an example top dielectric layer DL116 of the stack of FIG. 6B;

DESCRIPTION OF THE ENABL1NG EMBODIMENTS

The present disclosure is related to pre-charge techniques to pre-charge a plurality of channels in a memory block during a program-verify prior to an application of a programming pulse to a selected data word line in the memory block. According to techniques disclosed herein, programming the memory cells of a selected data word line in the memory block occurs in a plurality of program loops, each of which includes a programming pulse (VPGM pulse) and a program-verify operation. The memory block comprises memory cells connected to data word lines between a drain side and a source side. The memory block can be divided into sub-blocks, each of which comprises a set of data word lines of the memory block. One or more dummy word lines separate adjacent sub-blocks. During the program-verify operation, voltages are applied to the data word lines and the dummy word lines of the memory block to sense whether a memory cell connected to a selected data word line has successfully reached a target threshold voltage. At the end of the program-verify operation, a pre-charge voltage is applied to the source side of the memory block that pre-charges a first channel of memory cells connected to the selected data word line on the drain side of the one or more dummy lines. Also, at the end of the program-verify operation, voltages applied to a first set of data word lines on the drain side of the one or more dummy lines are lowered to a resting voltage. After the voltages applied to the first set of data word lines are lowered, voltages applied to the one or more dummy word lines on a source side of the selected data word line are lowered to the resting voltage, thereby cutting the first channel off (e.g., closing) of a second channel of memory cells on the source side of the one or more dummy word lines. By closing the first channel off, the pre-charge voltage can be locked into the first channel, which pre-charges this channel. Subsequent to closing the first channel, the voltages applied to a second set of data word lines of on the drain side of the one or more dummy word lines are lowered to the resting voltage. After the voltages applied to the second set of the word lines are lowered, a program pulse of a next program loop can be applied to a selected word line in the memory block to program the memory cells of the selected word line. These techniques allow for improved performance and reduced delays as compared to other pre-charging techniques and are discussed in further detail below.

Figure 1A:
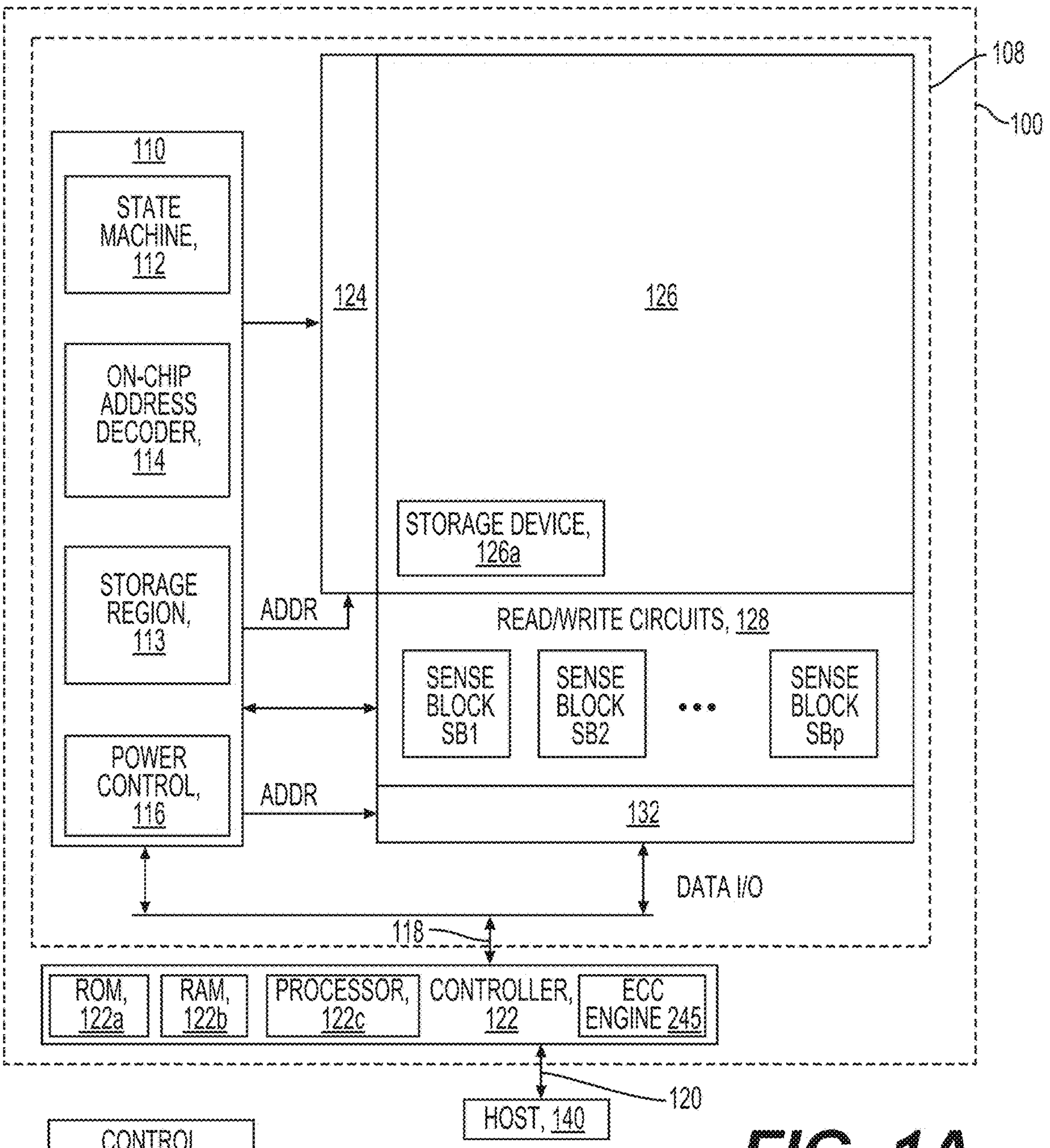
FIG. 1A is a block diagram of an example memory device.

FIG. 1A is a block diagram of an example memory device 100 is configured to operate according to the pre-charging techniques of the present disclosure. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and program-verify operation for one set of memory cells, wherein the one set of memory cells comprises memory cells assigned to represent one data state among a plurality of data states and memory cells assigned to represent another data state among the plurality of data states; the program and program-verify operation comprising a plurality of program and program-verify iterations; and in each program and program verify iteration, the programming circuit performs programming for the one selected word line after which the programming circuit applies a,. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

Figure 1B:
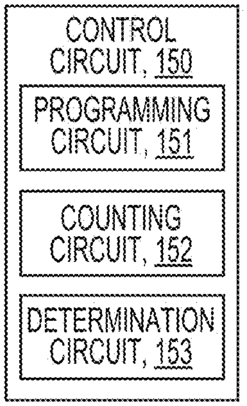
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122*c*, storage devices (memory) such as ROM 122*a* and RAM 122*b* and an error-correction code (ECC) engine 245. The ECC engine can correct a number of read errors, which are caused when the upper tail of a Vth distribution becomes too high. However, uncorrectable errors may exist in some cases. The techniques provided herein reduce the likelihood of uncorrectable errors.

The storage device(s) 122*a*, 122*b* comprise, code such as a set of instructions, and the processor 122*c* is operable to execute the set of instructions to provide the functionality described herein. Alternately or additionally, the processor 122*c* can access code from a storage device 126*a* of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122*c* fetches the boot code from the ROM 122*a* or storage device 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

Figure 1C:
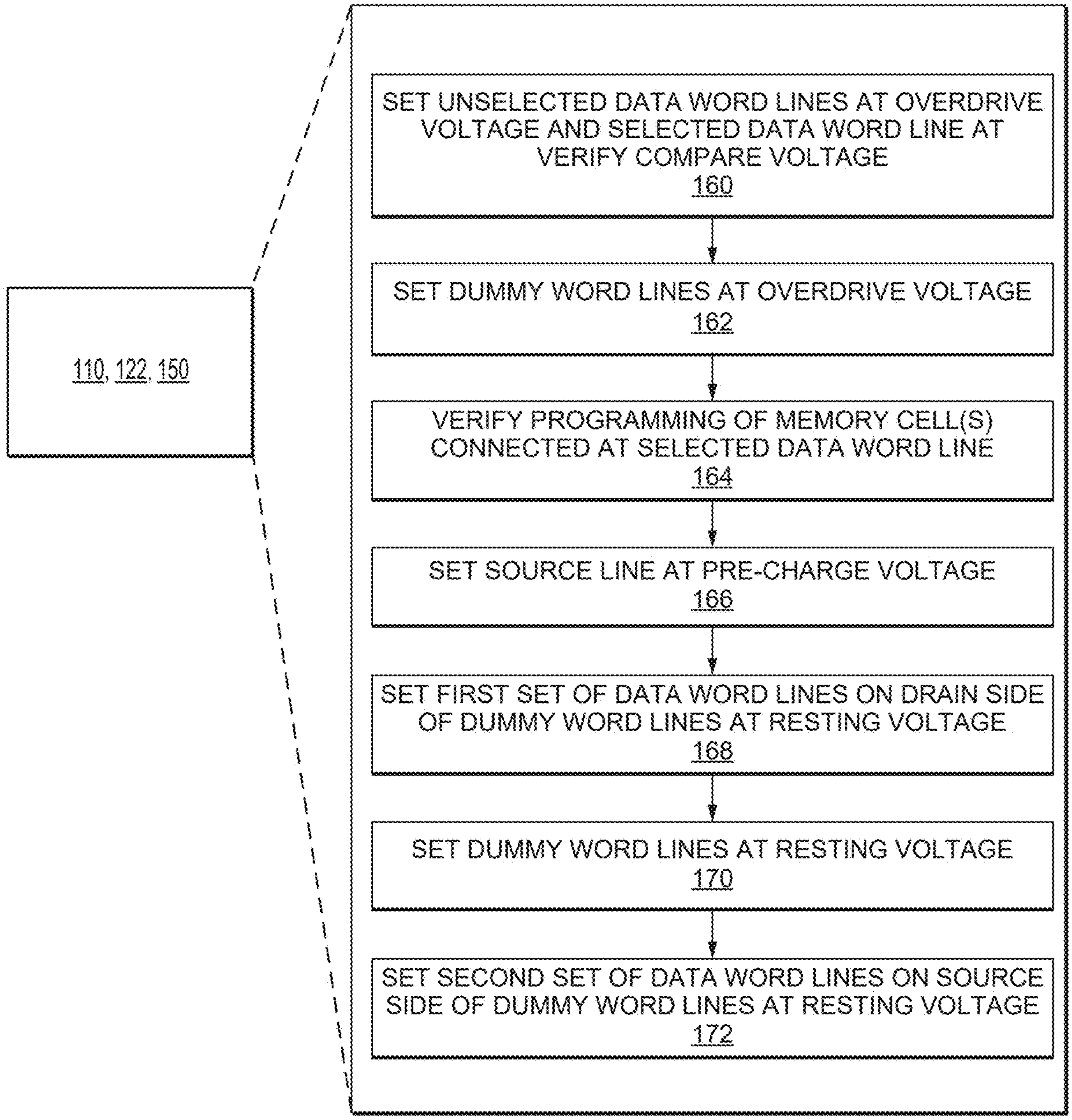
FIG. 1C is a block diagram illustrating that the memory device of FIG. 1A is configured to operate according to a pre-charge technique according to the present disclosure.

FIG. 1C illustrates that the control circuitry 110, controller 122, and/or control circuit 150 are configured to operate according to the pre-charging techniques of the subject disclosure. Specifically, these components are configured to perform a program-verify operation that includes a pre-charge process.

At step 160, an overdrive voltage (e.g., Vread) is applied to unselected data word lines of a memory block and a verify compare voltage (e.g., VCG_RV) is applied to a selected data word line. The memory block comprises a source side, a drain side, and one or more dummy word lines on a source side of the selected data word line. At step 162, which may be in parallel or included with step 160, the overdrive voltage is applied to the one or more dummy word lines. At step 164, programming of one or more memory cell connected to the selected data word line is verified based on the verify compare voltage. At step 166, a pre-charge voltage (e.g., VDDSA) is applied to a source line on the source side of the memory block. The pre-charge voltage is provided to at least unselected data word lines on a drain side of the selected word line by virtue of overdrive voltage applied to the unselected data word lines. At step 168, the voltage applied to a first set of data word lines on the drain side of the one or more dummy word lines is lowered to a resting voltage. The first set of data word lines comprises the selected data word line and unselected data word lines on the drain side of the dummy word line. At step 170, the voltage applied to the one or more dummy word lines is lowered to the resting voltage after step 168, which cuts off the channel connected to the first set of data word lines from the pre-charge voltage thereby locking the pre-charge voltage in the channel. Subsequently, the voltage applied to a second set of data word lines on the source side of the one or more dummy word lines is lowered to a resting voltage. Upon completion of the pre-charge process, at step 172, a boosting voltage can be applied to the data word lines of the memory block and a programming pulse can be applied to a selected word line of the memory block to program one or more memory cells in the selected word line for a next program loop.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate, which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements, which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . , which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve data word lines, for example, WL0-WL111, extend between the SGSs and the SGDs. In some embodiments, the memory block may include more or fewer than one hundred and twelve data word lines. For example, in some embodiments, a memory block includes one hundred and sixty-four data word lines. In some cases, dummy word lines, which contain no user data, can also be used in the memory array adjacent to the select gate transistors. Such dummy word lines can shield the edge data word line from certain edge effects. As used herein, the term “word lines” may be refer to collections of dummy word lines and data word lines and the term “word line” may refer to a dummy word line or a data word lines, unless explicitly stated as to which type of word line is referenced.

Figure 3A:
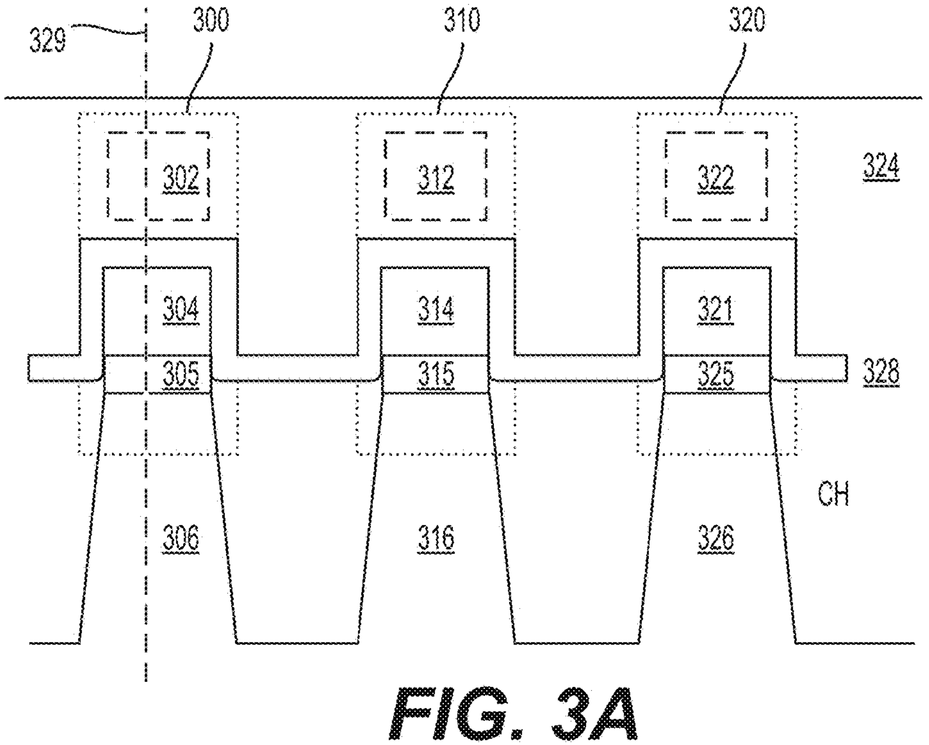
FIG. 3A (Related Art)
FIG. 3A and FIG. 3B depict cross-sectional views of example floating gate memory cells in NAND strings.
Figure 3B:
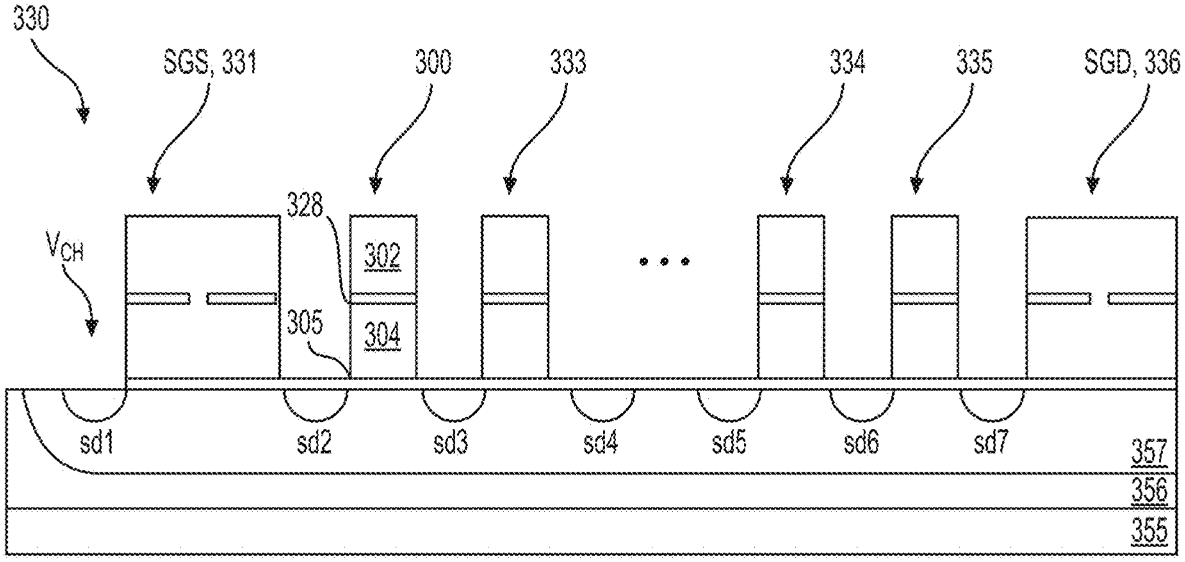

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide (“ONO”) is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings, which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio, which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
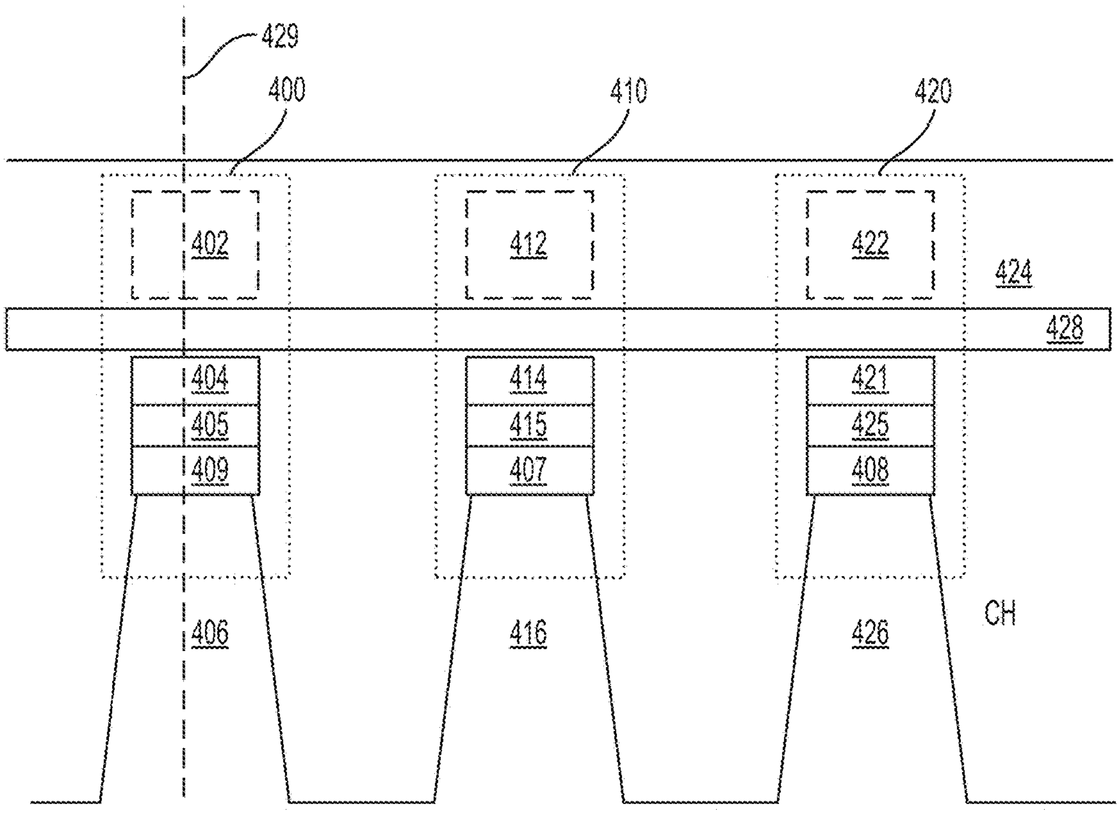
FIG. 4A (Related Art)
FIG. 4A and FIG. 4B depict cross-sectional views of example charge-trapping memory cells in NAND strings.
Figure 4B:
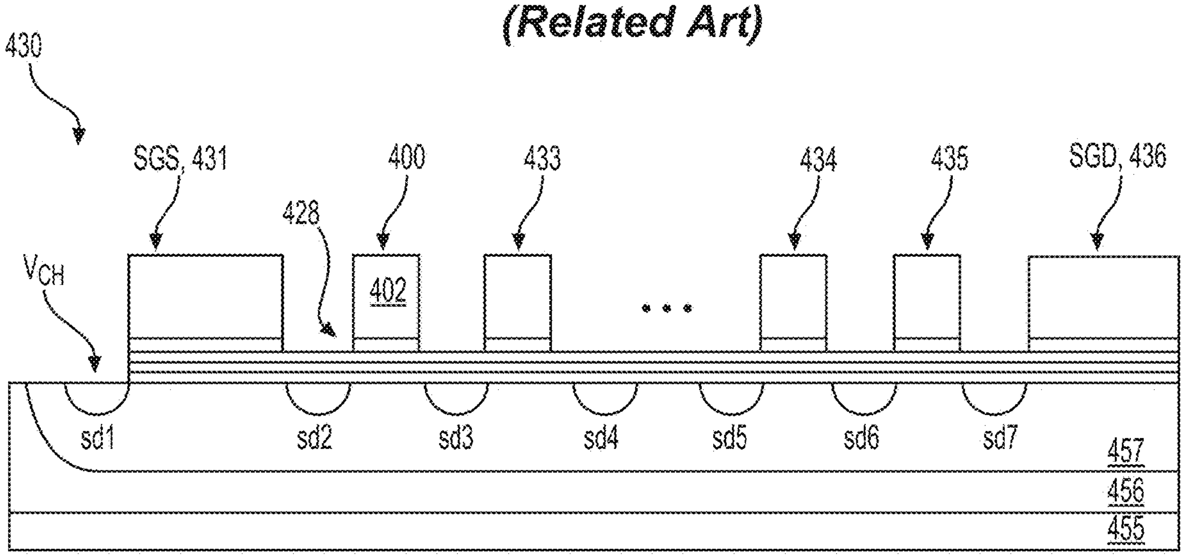
FIG. 4B (Related Art)

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings, which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate that comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
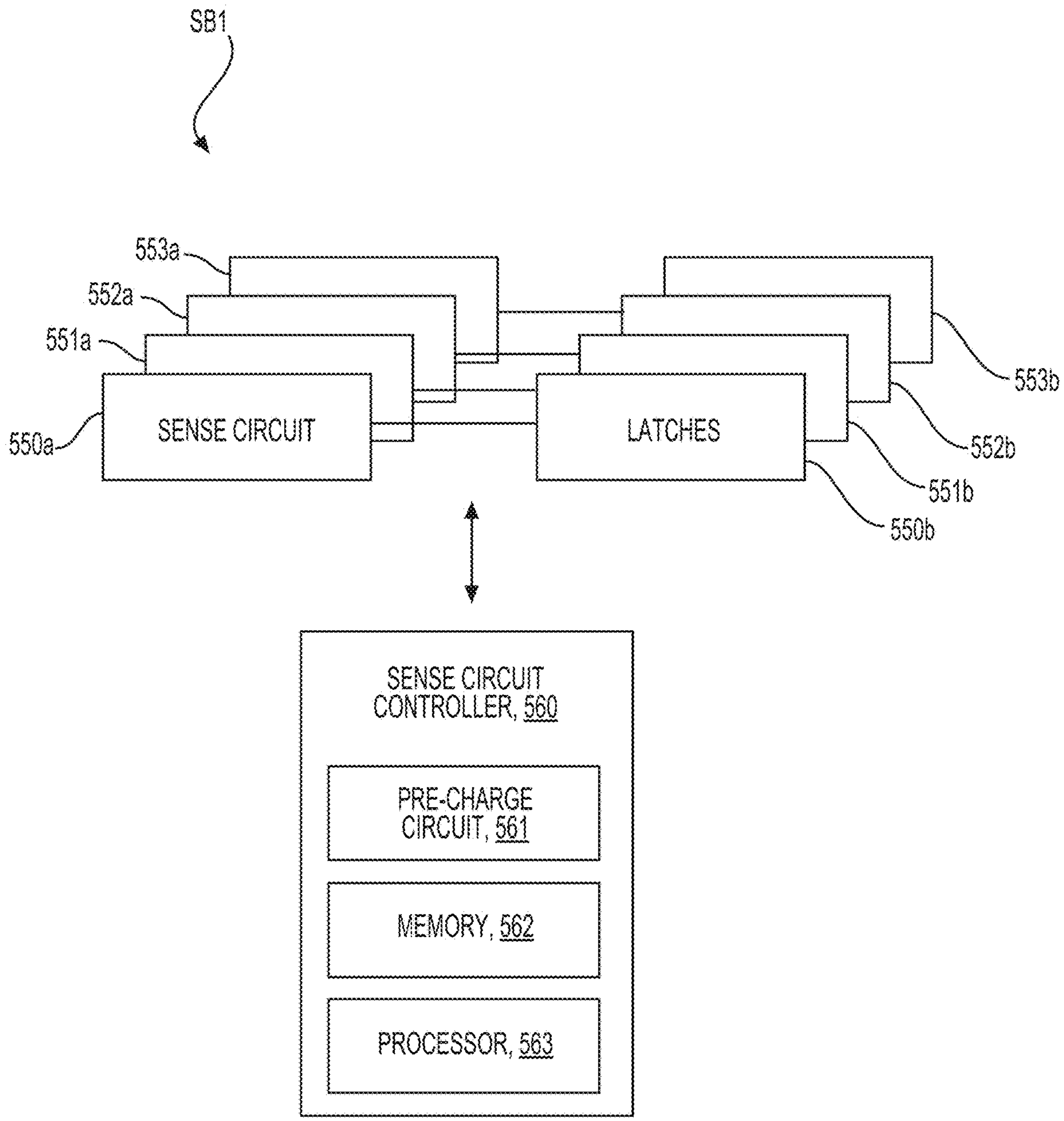
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550*a*, 551*a*, 552*a*, and 553*a* are associated with the data latches 550*b*, 551*b*, 552*b*, and 553*b*, respectively. In one approach, different subsets of bit lines can be sensed using different respective sense blocks. This allows the processing load, which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561, which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code, which is executable by the processor to perform the functions described herein. These functions can include reading the latches 550*b*, 551*b*, 552*b*, 553*b* that are associated with the sense circuits 550*a*, 551*a*, 552*a*, 553*a*, setting bit values in the latches and providing voltages for setting pre-charge levels in sense nodes of the sense circuits 550*a*, 551*a*, 552*a*, 553*a*. Further example details of the sense circuit controller 560 and the sense circuits 550*a*, 551*a*, 552*a*, 553*a* are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
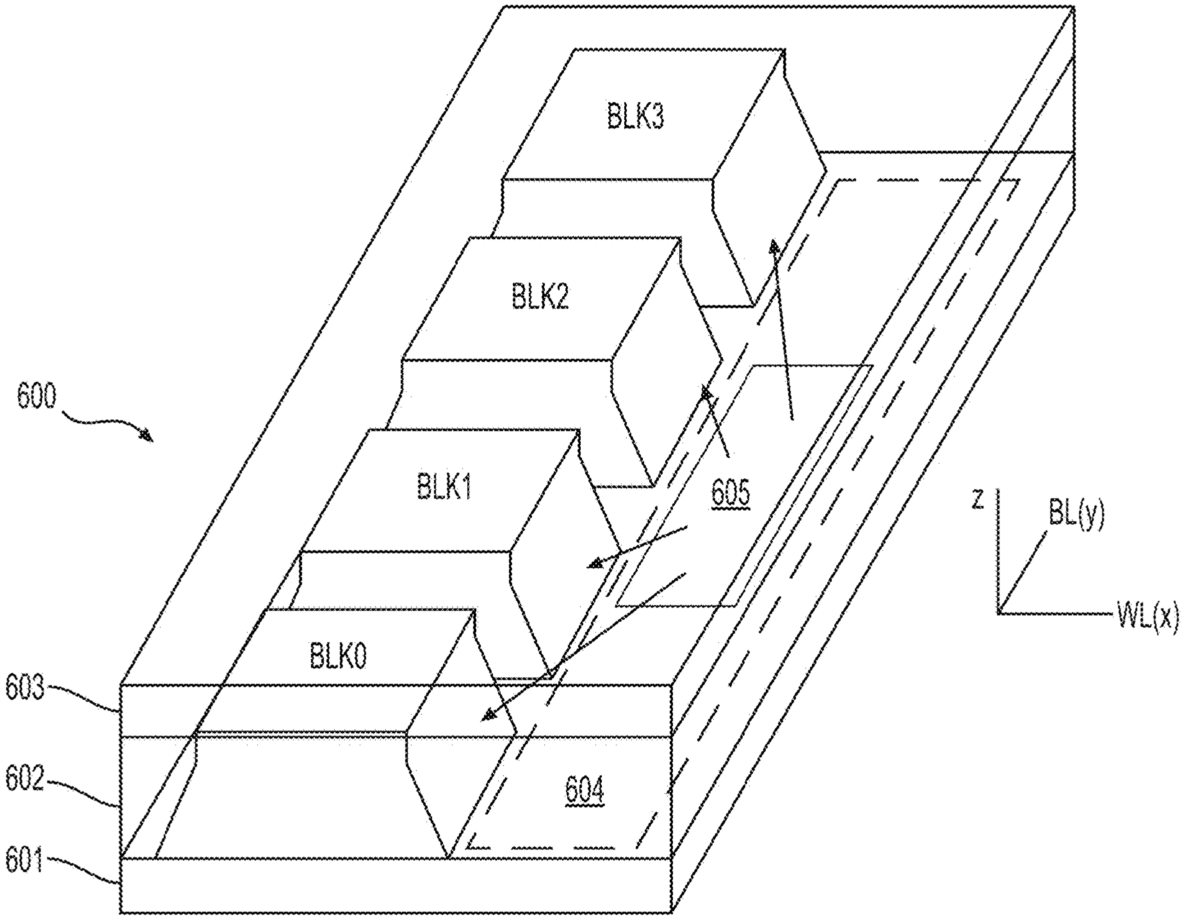
FIG. 6A (Related Art)
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605, which can be connected to control gate layers of the blocks BLK0, BLK1, BLK2, and BLK3. In one approach, control gate layers at a common height in the blocks BLK0, BLK1, BLK2, and BLK3 are commonly driven. The substrate 601 can also carry circuitry under the blocks BLK0, BLK1, BLK2, BLK3, along with one or more lower metal layers, which are patterned in conductive paths to carry signals of the circuitry. The blocks BLK0, BLK1, BLK2, and BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, and BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
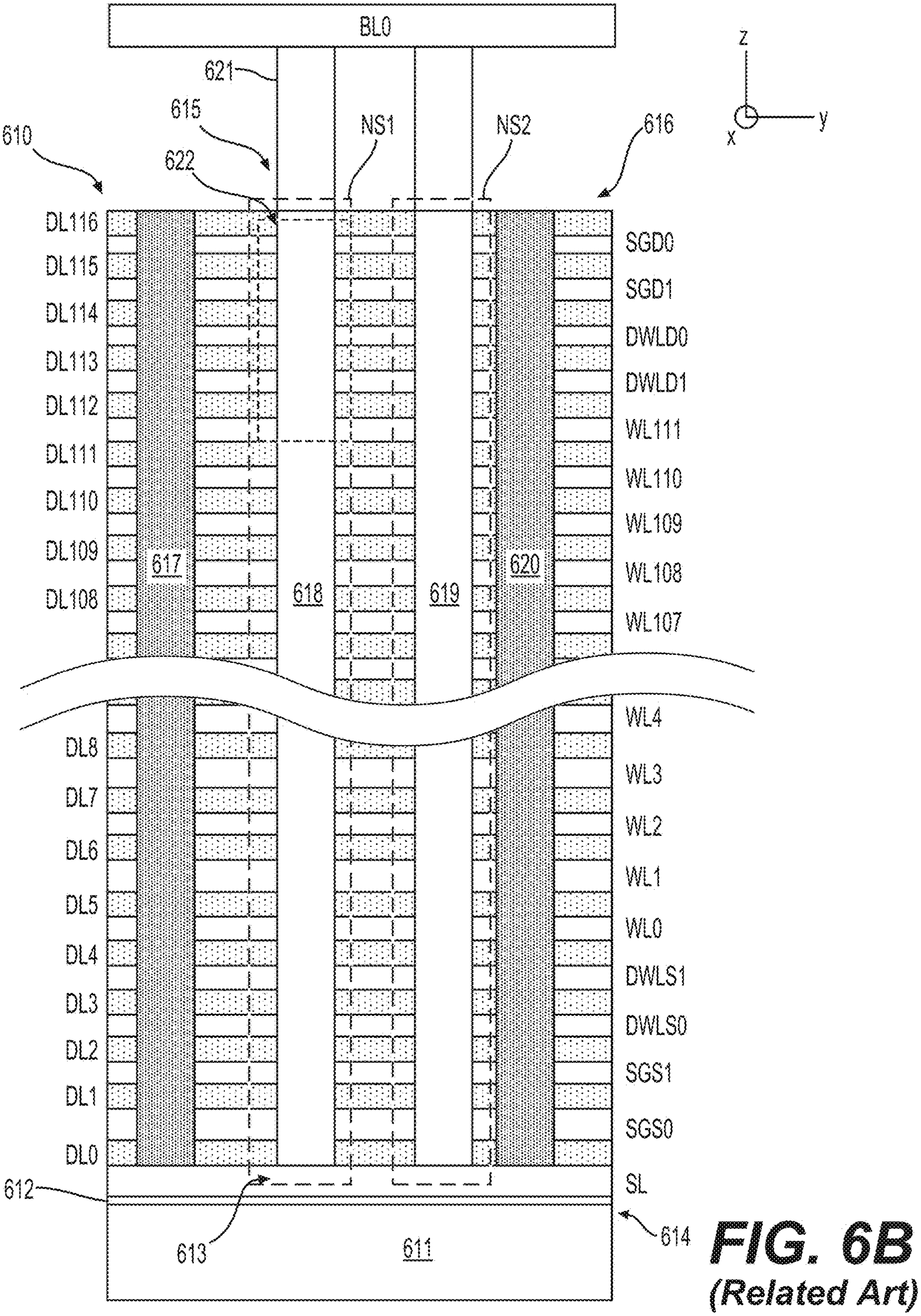
FIG. 6B (Related Art)
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers WL0-WL111. The dielectric layers are labelled as DL0-DL116. Further, regions of the stack 610 which comprise NAND strings NS1 and NS2 are illustrated. Each NAND string encompasses a memory hole 618, 619 that is filled with materials, which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
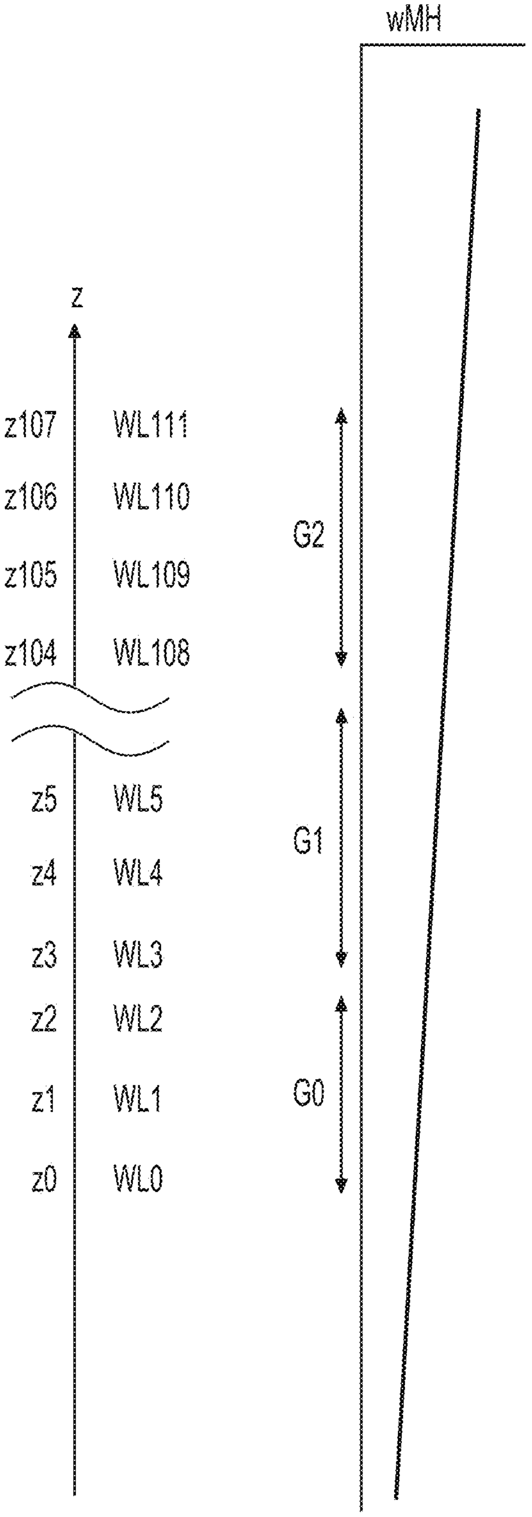
FIG. 6C (Related Art)
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
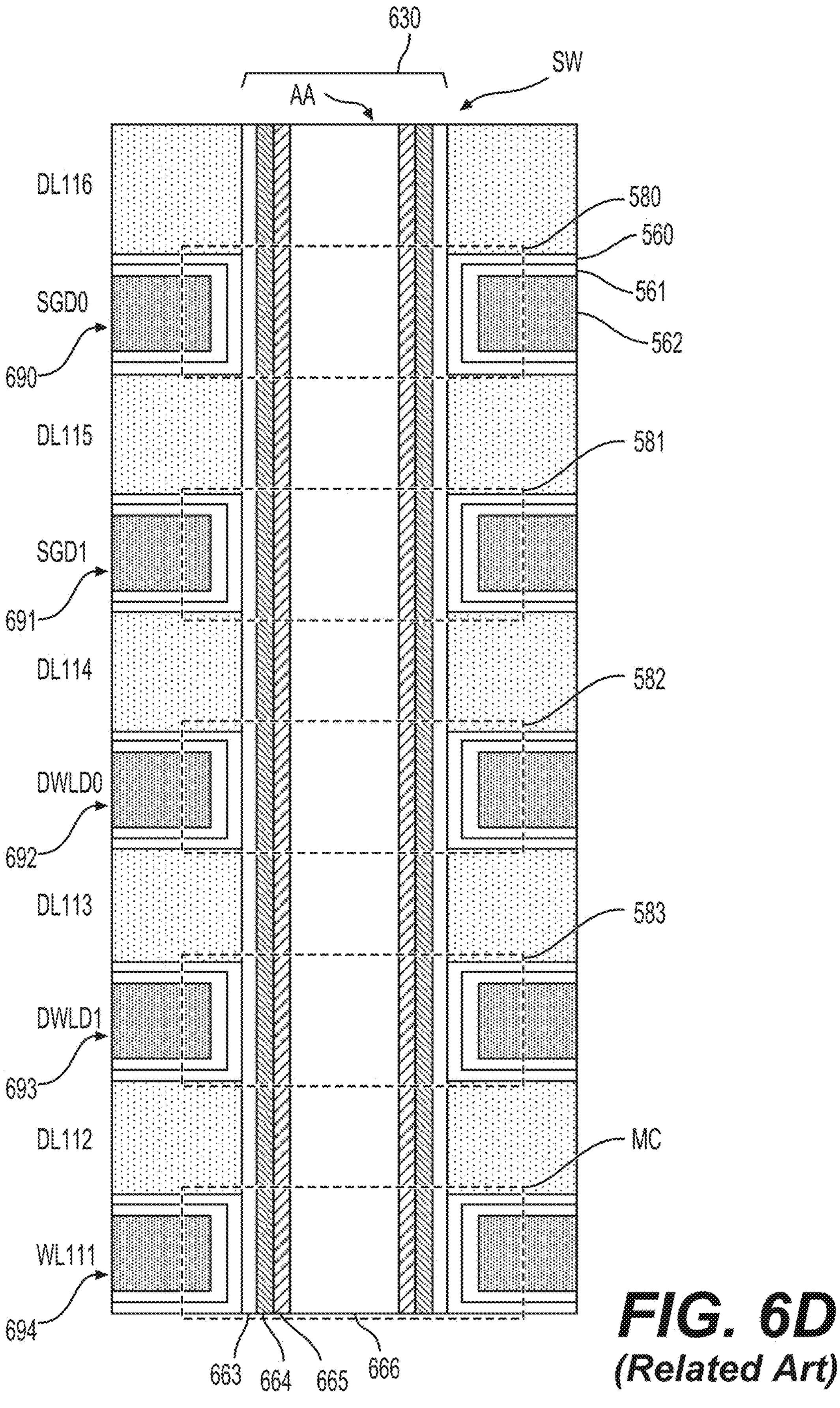
FIG. 6D (Related Art)
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar that is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer, which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

FIG. 7A illustrates a top view of an example data word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are data word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group, which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void, which is created by the removal of the sacrificial material. For example, the distance between contact line connectors may allow for a few rows of memory holes between adjacent contact line connectors. The layout of the memory holes and contact line connectors should also account for a limit in the number of bit lines, which can extend across the region while each bit line is connected to a different memory cell. After processing the data word line layers, the contact line connectors can optionally be filed with metal to provide an interconnect through the stack.

In this example, there are four rows of memory holes between adjacent contact line connectors. A row here is a group of memory holes, which are aligned in the x-direction. Moreover, the rows of memory holes are in a staggered pattern to increase the density of the memory holes. The data word line layer or data word line is divided into regions WL0*a*, WL0*b*, WL0*c* and WL0*d* that are each connected by a contact line 713. The last region of a data word line layer in a block can be connected to a first region of a data word line layer in a next block, in one approach. The contact line 713, in turn, is connected to a voltage driver for the data word line layer. The region WL0*a* has example memory holes 710, 711 along a contact line 712. The region WL0*b* has example memory holes 714, 715. The region WL0*c* has example memory holes 716, 717. The region WL0*d* has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a data word line layer or SG layer. Example circles shown with dashed lines represent memory cells which are provided by the materials in the memory hole and by the adjacent data word line layer. For example, memory cells 720, 721 are in WL0*a*, memory cells 724, 725 are in WL0*b*, memory cells 726, 727 are in WL0*c*, and memory cells 728, 729 are in WL0*d*. These memory cells are at a common height in the stack.

Contact line connectors (e.g., slits, such as metal-filled slits) 701, 702, 703, 704 may be located between and adjacent to the edges of the regions WL0*a*-WL0*d*. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116*a*, DL116*b*, DL116*c* and DL116*d*. Each region can be connected to a respective voltage driver. This allows a set of memory cells in one region of a data word line layer being programmed concurrently, with each memory cell being in a respective NAND string, which is connected to a respective bit line. A voltage can be set on each bit line to allow or inhibit programming during each program voltage.

The region DL116*a* has the example memory holes 710, 711 along a contact line 712, which is coincident with a bit line BL0. A number of bit lines extend above the memory holes and are connected to the memory holes as indicated by the "X" symbols. BL0 is connected to a set of memory holes, which includes the memory holes 711, 715, 717, 719. Another example bit line BL1 is connected to a set of memory holes, which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 8:
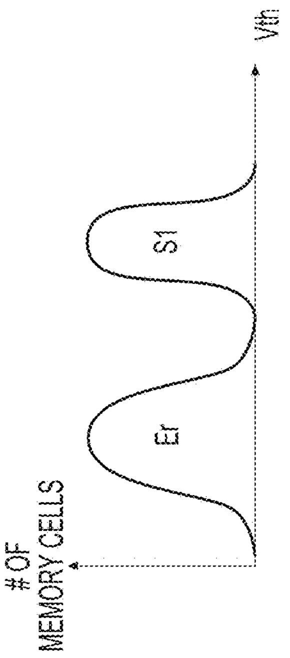
FIG. 8 depicts a threshold voltage distribution of a page of memory cells programmed to one bit per memory cell (SLC)

The memory cells of the memory blocks discussed above can be erased, programmed and read. At the end of a successful programming operation, threshold voltages of the memory cells should be within one or more distributions of threshold voltages for programmed memory cells or within a distribution of threshold voltages for erased memory cells, as appropriate. For example, FIG. 8 depicts a threshold voltage Vth distribution of a group of memory cells programmed according to a one bit per memory cell (SLC) storage scheme. In the SLC storage scheme, there are two data states, including the erased state (Er) and a single programmed data state (S1). FIG. 8 shows two threshold voltage distributions, one for the erased state (Er) and the single programmed data state (S1). Memory cells that have threshold voltages in threshold voltage distribution Er are, therefore, in the erased data state (e.g., they are erased). Memory cells that have threshold voltages in threshold voltage distribution S1 are, therefore, in the programmed data state (e.g., they are programmed). FIG. 8 also depicts read compare voltage Vr. By testing (e.g., performing one or more sense operations) whether the threshold voltage of a given memory cell is above or below Vr, the memory device can determine a memory cells is in the erased state (Er) or programmed data state (S1). Furthermore, FIG. 8 depicts a verify reference voltage Vv. In some embodiments, when programming memory cells to programmed data state S1, the memory device can test whether those memory cells have a threshold voltage greater than or equal to Vv.

Figure 9:
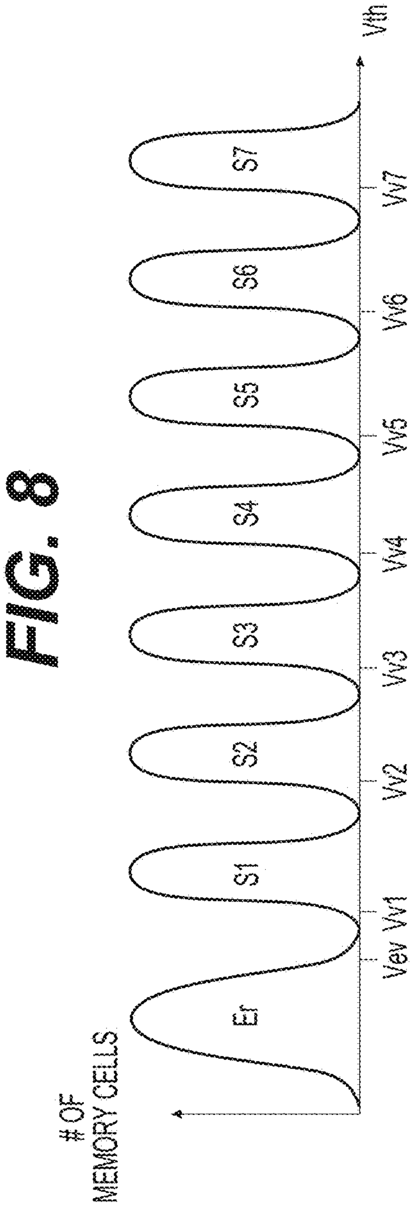
FIG. 9 depicts a threshold voltage distribution of a page of memory cells programmed to three bits per memory cell (TLC)
Figure 10:
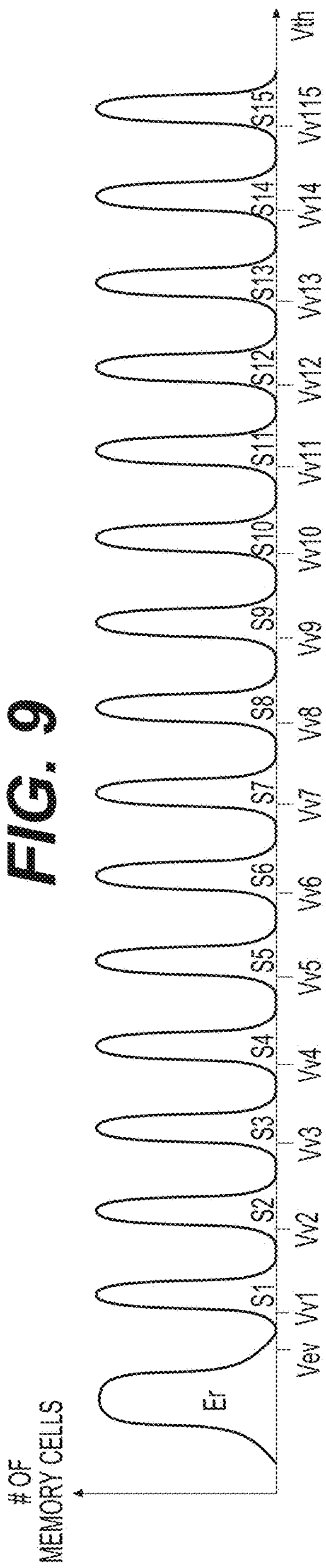
FIG. 10 depicts a threshold voltage distribution of a page of memory cells programmed to four bits per memory cell (QLC)

FIGS. 9 and 10 illustrate example threshold voltage distributions for the memory array when each memory cell stores multiple bit per memory cell data. Memory cells that store multiple bit per memory cell data are referred to as multi-level cells ("MLC"), FIG. 9 illustrates the threshold voltage Vth distribution of a three bits per cell (TLC) storage scheme that includes eight total data states, namely the erased state (Er) and seven programmed data states (S1, S2, S3, S4, S5, S6, and S7). FIG. 10 depicts a threshold voltage Vth distribution of a four bits per cell (QLC) storage scheme that includes sixteen total data states, namely the erased state (Er) and fifteen programmed data states (S1-S15). Other storage schemes are also available, such as two bits per cell with four data states or five bits per cell (PLC) with thirty-two data states.

Referring to FIG. 9 as an illustrative example, each programmed data state (S1-S7) is associated with a respective read compare voltage (Vr1-Vr7), which can be employed for reading data from memory cells. By testing (e.g., performing sense operations) whether the threshold voltage of a given memory cell is above or below the read compare voltages, the memory device can determine what data state (i.e., S1-S7) a memory cell is in. Note that, while not explicitly shown in FIG. 10 for legibility purposes, each programmed data state (S1-S15) can be associated with a respective read compare voltage (Vr1-Vr15).

Each programmed data state (S1-S7) is also associated with a respective verify voltage (Vv1-Vv7), which is employed during a program verify portion of a programming operation. In some embodiments, when programming memory cells to data state S1, the memory device will test whether those memory cells have a threshold voltage greater than or equal to Vv1. When programming memory cells to data state S2, the memory device will test whether the memory cells have threshold voltages greater than or equal to Vv2. Thus, for example, when programming memory cells to a data state, the memory device will determine whether memory cells have their threshold voltage greater than or equal to the respective verify voltage. FIG. 9 also shows a verify voltage Vev, which is a voltage level to test whether a memory cell has been properly erased.

In an embodiment that utilizes full sequence programming, memory cells can be programmed from the erased data state Er directly to any of the programmed data states (e.g., S1-S7 in the example of FIG. 9) using the process of FIGS. 11 and/or 13 (discussed below). For example, a population of memory cells to be programmed may first be erased so that all memory cells in the population are in the erased state Er. Then, a programming process is used to program memory cells directly into programmed data states (e.g., S1-S7 in the example of FIG. 9). For example, while some memory cells are being programmed from erased state Er to programmed data state S1, other memory cells can be programmed from erased state Er to programmed data state S2 and/or from to programmed data state S3, and so on. In some embodiments, programmed data states can overlap, with control circuitry 110, controller 122, and/or control circuit 150 relying on error correction to identify the correct data being stored. Note that in some embodiments, rather than using full sequence programming, the system can use multi-pass programming processes known in the art.

In general, during program-verify operation and read operations, a selected data word line is connected to a voltage (one example of a reference signal), a level of which is specified for each read operation (e.g., read compare voltage Vr1-Vr7 in the example of FIG. 9) or program-verify operation (e.g. verify voltages Vv1-Vv7 in the example of FIG. 9) in order to determine whether a threshold voltage of the concerned memory cell has reached such level. After applying the data word line voltage, the conduction current of the memory cell is measured to determine whether the memory cell turned on (conducted current) in response to the voltage applied to the data word line. If the conduction current is measured to be greater than a certain value, then it is assumed that the memory cell turned on and the voltage applied to the data word line is greater than the threshold voltage of the memory cell. If the conduction current is not measured to be greater than the certain value, then it is assumed that the memory cell did not turn on and the voltage applied to the data word line is not greater than the threshold voltage of the memory cell. During a read or program-verify operation, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or program-verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 11:
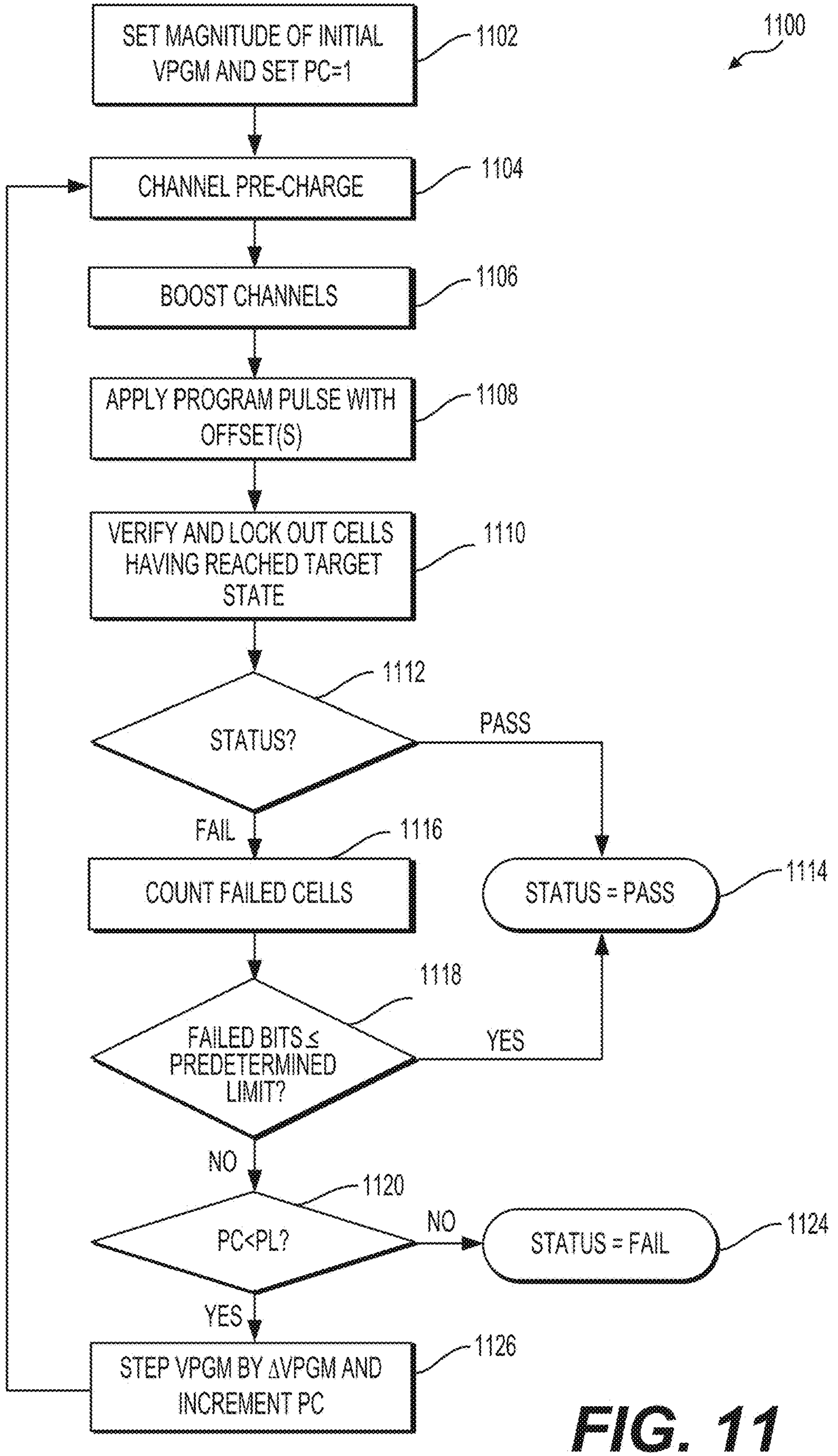
FIG. 11 is a flow chart describing a process for programming an example memory block.

FIG. 11 is a flowchart describing one embodiment of a process 1100 for programming memory cells. For purposes of this document, the term program and programming are synonymous with write and writing. In one example embodiment, the process 1100 can be performed for memory array 126 using the one or more control circuits (e.g., control circuitry 110, controller 122, and/or controller 150) discussed above. The process 1100 may include multiple loops (referred to as program loops), each of which includes a program operation and a program-verify operation. The process 1100 can be performed to implement the full sequence programming, as well as other programming schemes including multi-pass programming, which comprises programming processes that use multiple passes to complete programming. When implementing multi-pass programming, the process 1100 can be used to implement any/each pass of the multi-pass programming process.

During a program operation, the program voltage is applied to the control gates (via a selected data word line) as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 1102, the programming voltage signal (Vpgm) is initialized to a starting magnitude (e.g., between approximately 12 and –16V or another suitable level) and a program counter PC maintained by state machine 112 is initialized at 1, In an example, a group of memory cells selected to be programmed (referred to herein as the selected memory cells) are programmed concurrently and are all connected to the same data word line (referred to herein as the selected data word line). There will likely be other memory cells that are not selected for programming (referred to herein as unselected memory cells) that are also connected to the selected data word line. That is, the selected data word line may also be connected to memory cells that are to be inhibited from programming. Additionally, as memory cells reach their intended target data state, they will be inhibited from further programming. Those NAND strings (e.g., unselected NAND strings) that include memory cells connected to the selected data word line that are to be inhibited from programming have their channels boosted to inhibit programming. When a channel has a boosted voltage, the voltage differential between the channel and the data word line is not large enough to cause programming. To assist in the boosting, in step 1104 the control die will pre-charge channels of NAND strings that include memory cells connected to the selected data word line that are to be inhibited from programming. In some embodiments, pre-charging the channels of unselected NAND strings cleans out the channel of electrons and raises the channel to a low positive voltage (e.g., approximately 1-1,3 v). In step 1106, NAND strings that include memory cells connected to the selected data word line that are to be inhibited from programming have their channels boosted to inhibit programming. Such NAND strings are referred to herein as "unselected NAND strings." In some examples, the unselected data word lines receive one or more boosting voltages (e.g., approximately 7-11 volts), also referred to as pass voltages, to perform boosting schemes. A program inhibit voltage is applied to the bit lines coupled the unselected NAND string. In one example, the channel is pre-charged to −2 volts in step 1104 and then floated. In step 1106, the channel is boosted up from the 2 volts to a boosting voltage of approximately 8-10 volts.

In step 1108, a program voltage pulse of the programming voltage signal Vpgm is applied to the selected data word line (the data word line selected for programming). In some embodiments, the magnitude and/or pulse width of the program voltage pulse can be modified from the standard magnitude and/or pulse width by one or more offsets, as described below. If a memory cell on a NAND string should be programmed, then the corresponding bit line is biased at a program enable voltage. In step 1108, the program pulse is concurrently applied to all memory cells connected to the selected data word line so that all of the memory cells connected to the selected data word line are programmed concurrently (unless they are inhibited from programming). That is, they are programmed at the same time or during overlapping times (both of which are considered concurrent). In this manner all of the memory cells connected to the selected data word line will concurrently have their threshold voltage change, unless they are inhibited from programming.

In step 1110, program-verify operation is performed and memory cells that have reached their target states can be locked out from further programming by the one or more control circuits (e.g., system control circuitry 110, controller 122, and/or controller 150). Step 1110 includes performing verification of programming by sensing at one or more verify compare levels. In some examples, the verification process is performed by testing whether the threshold voltages of the memory cells selected for programming have reached the appropriate verify voltage. In an example that corresponds to FIG. 9, the process 600 can be concurrently performed for memory cells being programmed to data states S1, S2, S3, S4, S5, S6, and S. In this example, step 1110 can include testing for each of data states S1, S2, S3, S4, S5, S6, and S7 (e.g., testing to see whether memory cells have threshold voltages greater than Vv1, Vv2, Vv3, Vv4, Vv5, Vv6, and Vv7). In another example, the system may test for a subset of data states S1, S2, S3, S4, S5, S6, and S7 during each loop of steps 1104-1126 based on the current threshold voltages of the memory cells, in what is known as a smart verify process. In step 1110, a memory cell may be locked out after the memory cell has been verified (by a test of the Vth) that the memory cell has reached its target state.

If, in step 1112, it is determined that all of the memory cells have reached their target threshold voltages (pass), the programming process is complete and successful because all selected memory cells were programmed and verified to their target states, A status of "PASS" is reported in step 1114. Otherwise, if in step 1112, it is determined that not all of the memory cells have reached their target threshold voltages (fail), then the programming process continues to step 1116.

In step 1116, the number of memory cells that have not yet reached their respective target threshold voltage distribution are counted. That is, the number of memory cells that have, so far, failed to reach their target state are counted. This counting can be done by state machine 112, circuitry 110, controller 122, control circuit 150, and/or another circuit. In an example, there may be one total count, which reflects the total number of memory cells currently being programmed that have failed the last verify step. In another example, separate counts are kept for each data state.

In step 1118, it is determined whether the count from step 1116 is less than or equal to a predetermined limit. In some examples, the predetermined limit is the number of bits that can be corrected by error correction codes (BCC) during a read process for the page of memory cells. If the number of failed cells is less than or equal to the predetermined limit, than the programming process can stop and a status of "PASS" is reported in step 1114. In this situation, enough memory cells programmed correctly such that the few remaining memory cells that have not been completely programmed can be corrected using ECC during the read process. In some examples, the predetermined limit used in step 1118 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells, In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1120 and the program counter (PC) is checked against the program limit value (PL). Examples of program limit values include 6, 12, 16, 19, 20 and 30; however, other values can be used. If the program counter (PC) is not less than the program limit value (PL), then the program process is considered to have failed and a status of "FAIL" is reported in step 1124, If the program counter (PC) is less than the program limit value (PL), then the process continues at step 1126 during which time the Program Counter (PC) is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 1126, the process loops back to step 61104 and another program pulse is applied to the selected data word line (by the control die) so that another loop (steps 1104-1126) of the programming process 600 is performed. The loop (steps 1104-1126) of the programming process 600 may be referred to as a program loop.

In some embodiments, memory cells are programmed in an order from the source side to the drain side. For example, first the process 600 is performed to program memory cells connected to WL0, followed by using the process 600 to program memory cells connected to WL1, followed by using the process 600 to program memory cells connected to WL2, followed by using the process of 600 to program memory cells connected to WL3, . . . followed by using the process 600 to program memory cells connected to the final WL(e.g., WL111 in the example of FIGS. 2, 6B, and 6C). This order of programming may be referred to as normal order programming (NOP).

In another embodiment, memory cells are programmed in an order from the drain side to the source side. For example, first the process 600 is performed to program memory cells connected to the final WL111, followed by using the process 600 to program memory cells connected to WL110, . . . followed by using the process of FIG. 6 to program memory cells connected to WL1, and followed by using the process 600 to program memory cells connected to WL0. This order of programming may be referred to as reverse order programming (ROP).

In one embodiment memory cells are erased prior to programming. Erasing is the process of changing the threshold voltage of one or more memory cells from a programmed data state to an erased data state. For example, changing the threshold voltage of one or more memory cells from state S1 to state Er of FIG. 8, from states S1-S7 to state Er of FIG. 9, or from states S1-S15 to state Er of FIG. 10.

In some embodiments, the memory structure can be operated in sub-block mode, which allows any sub-block to be programmed or read individually. For example, in the embodiment of FIG. 11, data word lines have been divided into two sub-blocks SB0 and SB1. Each of these sub-blocks SB0 and SB2 includes a plurality of data word lines. FIG. 11 is illustrates an example cross-sectional view of a portion of one of the sense blocks, such as the cross-sectional view described above in connection with FIG. 6B. A joint 1205 including one or more dummy word lines that connect to dummy memory cells, which do not contain nor store data, separates adjacent sub-blocks from one another. In this example, SB0 is a "lower" sub-block as it is adjacent the source side 1213 (e.g., an example of source-end 613 described above) of the memory block and SB2 is an "upper" sub-block as it is adjacent the drain side of the memory block. Conductive vias 1221 (e.g., examples of conductive vias 621 described above) connects the drain side of the memory block to bit line 1220 (e.g., an example of BL0 described above). As an example in which the NAND string comprises one hundred and twelve data word lines (e.g., WL0-WL111) extending between the SGSs and SDGs, as described above, SB0 may comprise data word lines WL0 to WLN (e.g., WL0-WL55) and dummy word line DL and SB1 may comprise dummy word line DU and data word lines WLN+1 to WL111 (e.g., WL56-WL111). In some embodiments, the memory block may be divided into more than two sub-blocks, for example, three, four, or more sub-blocks. In this case, each sub-block may comprise one or more dummy word lines of a respective joint therebetween. For example, in the case of three sub-blocks, SB0 may include DOL and DOU, SB1 may include DIU and DIL, and SB2 may include D2L and D2U.

When operating in sub-block mode, SB1 can be programmed before or after SB0 in the case of FIG. 11. Where more than two sub-blocks are included, SB1 can be programmed before or after SB0 and/or SB2; SB0 can be programmed before or after SB1 and/or SB2; and SB2 can be programmed before or after SB0 and/or SB1. Any order of programming the sub-blocks can be used. Each sub-block can be read without reading the other sub-blocks. When programming a sub-block, the memory cells can be programmed in an order from source side toward drain side (e.g., NOP) or from drain side to source side (e.g., ROP). In some example, sub-blocks can be erased independently while in other examples, the entire block is erased at one time.

Figure 13:
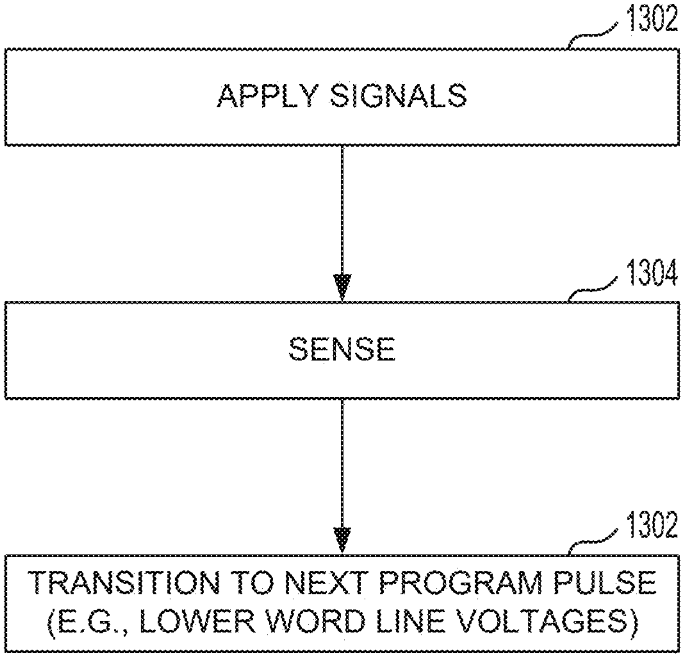
FIG. 13 is a flow chart describing a process for performing a program-verify operation.

FIG. 13 is a flow chart describing one embodiment of a process for performing a program-verify operation. That is, the process of FIG. 13 is an example implementation of a portion of step 1110 of FIG. 11. In step 1302 of FIG. 13, appropriate signals are applied to the data word lines, bit lines, source line and select lines to perform a sensing at one or more of the verify compare voltages (e.g., Vv1, Vv2, Vv3, Vy4, Vv5, Vv6, and Vy7 of FIG. 9). In step 1304, the sensing is performed to determine whether the selected memory cells being programmed have threshold voltages greater than the verify compare voltage being tested for. In step 1306, the systems transitions from program-verify operation to the next program loop (including the next program pulse). For example, the system lowers all of the data word line voltages to ground (or another resting voltage) in preparation for the next program loop (e.g. steps 1104-1126).

Figure 14:
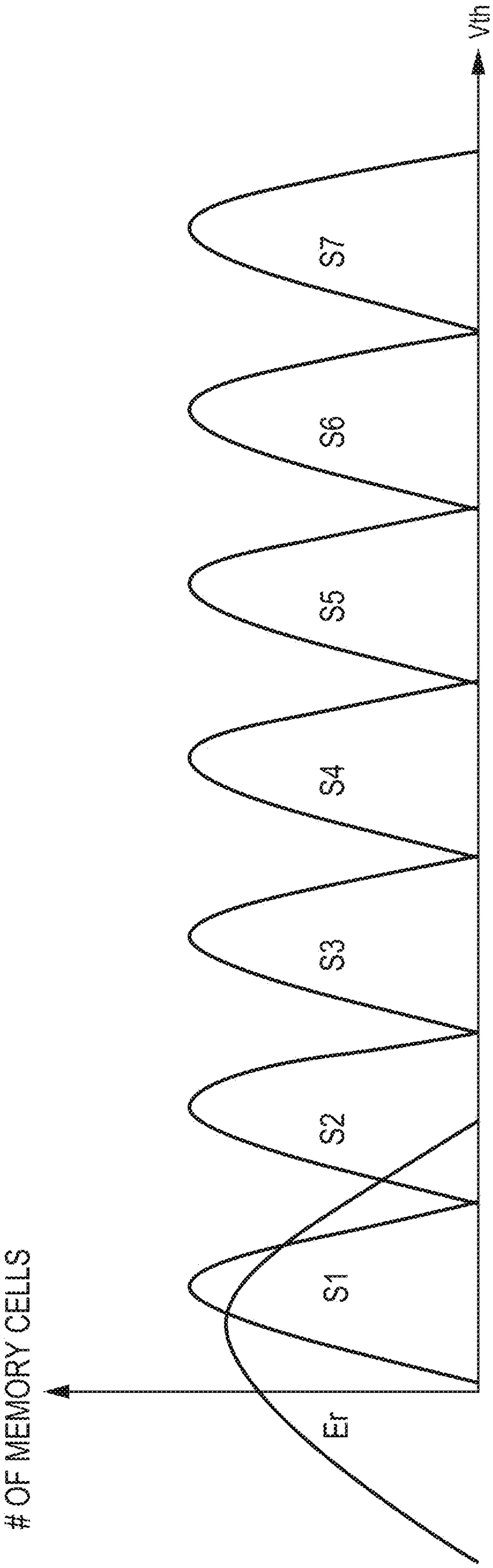
FIG. 14 is a threshold voltage distribution plot of a plurality of memory cells that have experienced program disturb.

In some circumstances, when transitioning from program-verify operation to the next program loop (e.g., pre-charging in step 1104, boosting in step 1106 and applying a program voltage pulse in step 1108) the channels of unselected NAND strings could be unwantedly pulled down to a negative voltage, which may undermine subsequent boosting and lead to a disturb. This concept is explained in more detail by FIGS. 14-18. A failure to adequately pre-charge the channel prior to programming can result in program disturb, or unintentional programming of some of the memory cells in the memory block (see, for example, the threshold voltage Vth distribution of FIG. 14) where an upper tail of the erased state distribution is deformed. Thus, electron pre-charge may not be effective at pre-charging the channels of the memory block in some situations.

Figure 15:
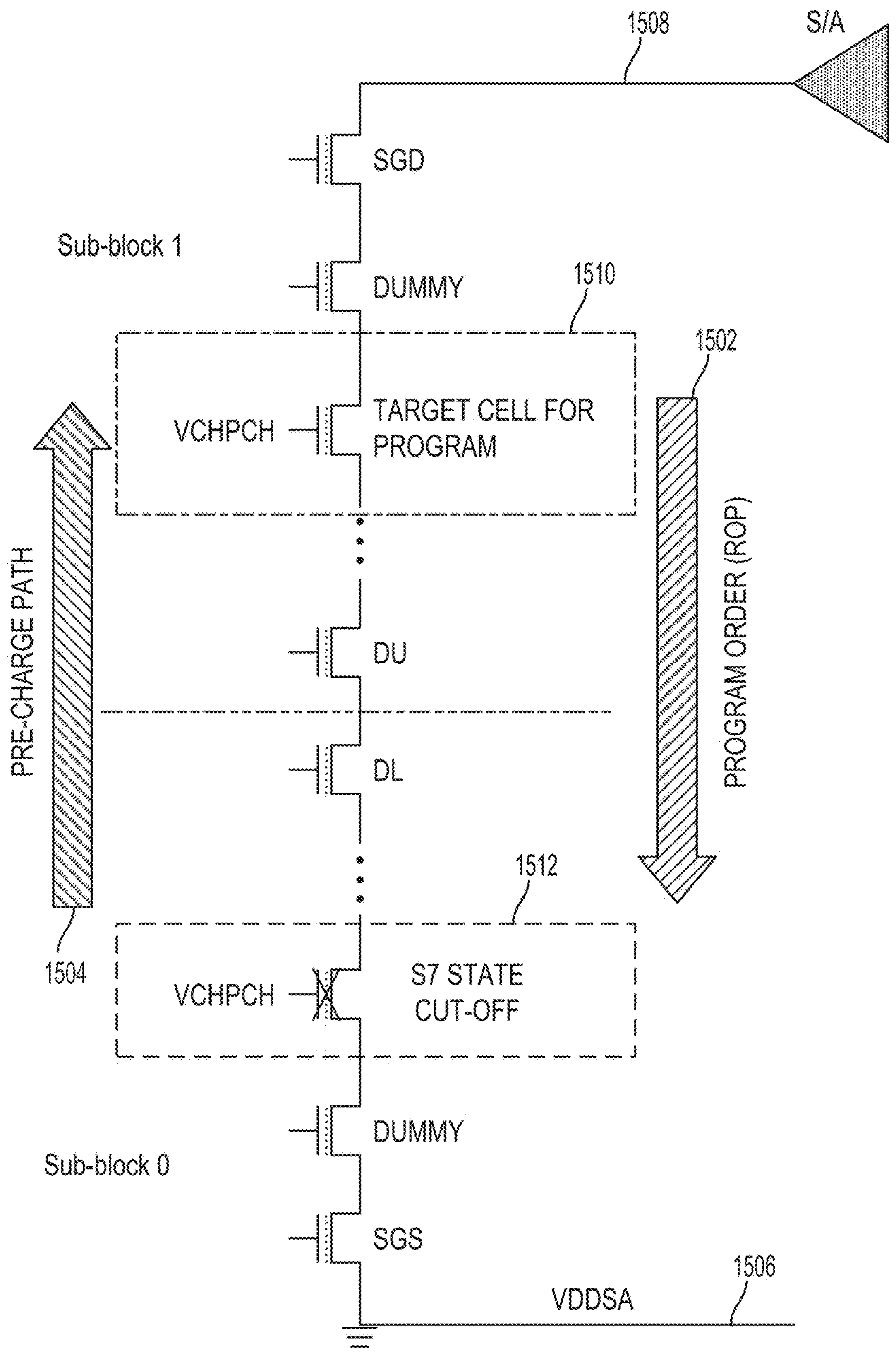
FIG. 15 is a schematic view of an example NAND string during one type of pre-charge operation.

FIG. 15 depicts a NAND string being pre-charged as part of a process to inhibit the NAND string from programming during a programming process. In this example, the block that the depicted NAND string resides in is divided into two sub-blocks (Sub-block 0 and Sub-block 1) and the order of programming is from the drain side to the source side (e.g., ROP as depicted by arrow 1402). Additionally, in this example, the pre-charging is performed from the source side to drain side (e.g., NOP as depicted by arrow 1404), as the source line 1506 is connected to VDDSA (e.g., a pre-charge voltage of approximately 1.3-2.5 v) and the bit line 1508 is connected to a sense amplifier (S/A). All of the memory cells (via data word lines) receive VCHPCH (e.g., approximately 1.3 v). SGD represents the drain side select gate. SGS represents the source side select gate. DU is a dummy memory cell in Sub-block 1 and DL is a dummy memory cell in Sub-block 0 such that the border (or joint) between Sub-block 0 and Sub-block 1 is between DU and DL. The target memory cell for programming is indicated by box 1410 and resides in Sub-block 1.

Figure 16:
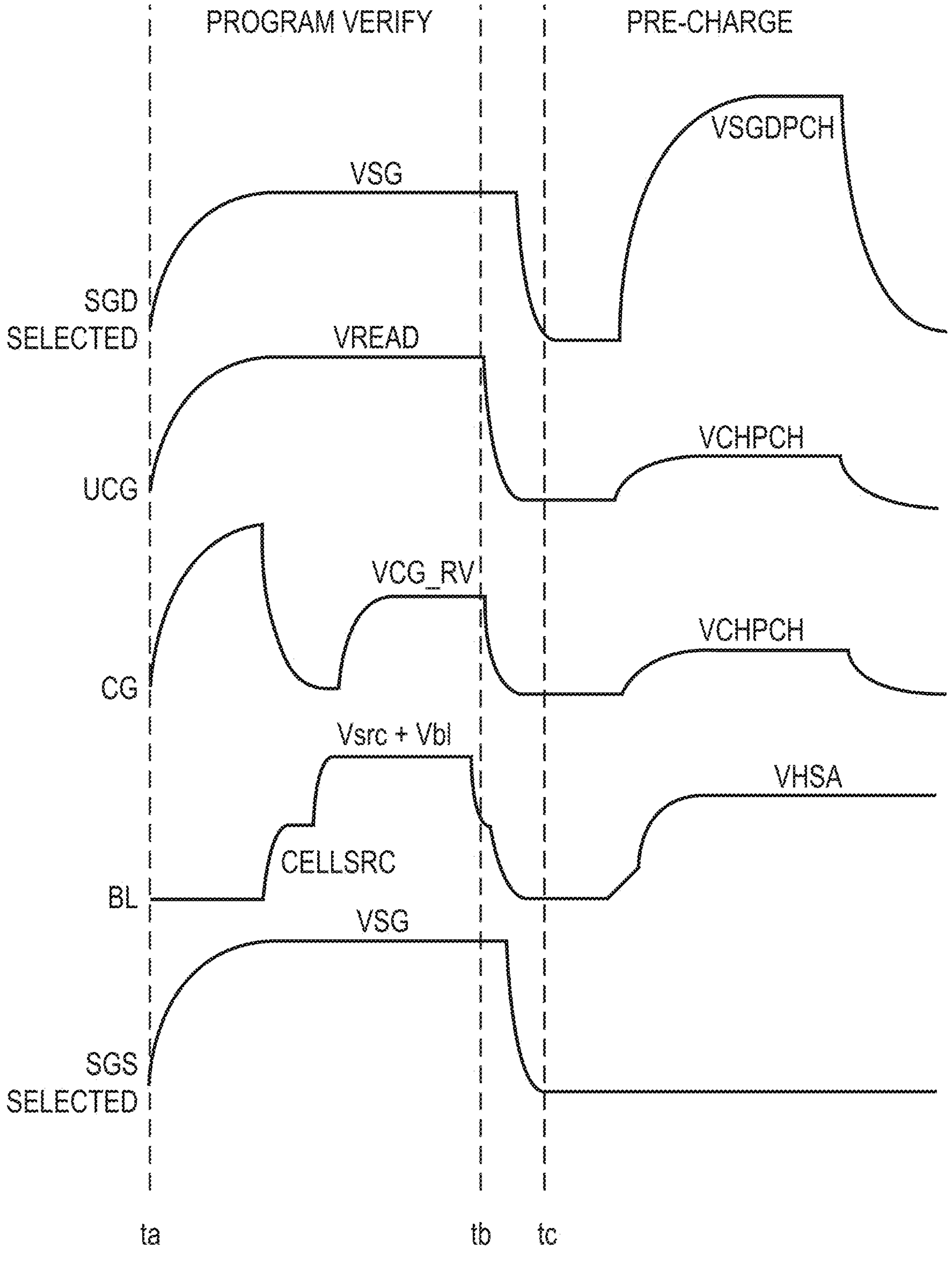
FIG. 16 illustrates voltage waveforms applied to various components of a memory block during a program loop that includes a program-verify operation and a pre-charge operation.

FIG. 16 is a signal diagram describing the behavior of various signals for the structure of FIG. 15 during program-verify and pre-charging operations. FIG. 16 shows the following signals: SGD selected, UCG, CG, BL and SGS Selected. The signal SGD selected is the drain side selection signal (SGD) for the selected region (e.g. of regions WL0_a_, WL0_b_, WL0_c_ and WL0_d_ described above in connection with FIG. 7A). UCG is the signal applied to gates of all unselected data word lines. CG is the signal applied to gates of the selected data word line (the data word line connected to the memory cells selected for programming). BL is the signal applied to the bit lines of the block. SGS selected is the signal applied to the source side selected lines (SGS in the example of FIG. 15). At a time ta, SGD Selected can be raised to VSG (which is a voltage high enough to turn on a transistor for the selected gate, which may be approximately 3.5-6v), UCG can be raised to Vread (e.g., 7-10 volts), a voltage spike can be applied to CG, and SGS Selected can be raised to VSG. Vread is an example of an overdrive voltage that can be used to turn on the memory cells so they fully conduct current regardless of which data state the memory cell is in. Shortly after the voltage spike on CG, CG can be raised to VCG_RV, which can be any of the verify voltages (e.g., Vv1, Vv2, Vv3, Vv4, Vv5, Vv6, and Vv7 in the example of FIG. 9) and the bit lines BL can be raised to Vsrc plus Vbl (e.g., 0.5-1.5 volts). The voltage Vsre is the voltage of the source line, which can be at ground or at a low voltage near ground, While CG is at VCG_RV, the memory cells can be sensed to see whether they have successfully reached their target threshold voltage. The time period of ta-tb represents steps 1302 and 1304 of FIG. 13 (e.g., a program-verify operation). Between tb and tc, all of the signals depicted in FIG. 16 can be lowered to ground (or another resting voltage), The time period of tb-tc represents step 1306 of FIG. 13. Starting at time to, the pre-charge process can be performed (e.g., step 1104 of FIG. 11). The signal SGD Selected can be raised to VSGDPCH, UCG and CG can be raised to VCHPCH, the bit lines BL can be raised to VDDSA (e.g., approximately 3.5 volts), and SGS Selected can be raised to VSGDPCH.

An issue regarding the channels of unselected NAND strings being pulled down to a negative voltage can occur between tb and tc. As the voltages ramp down on the data word lines (CG and UCG), a channel can be cut off and will float when the voltage on the data word lines reach the threshold voltages of the memory cells. The floating channels couple to the data word lines, but with the data word lines continuing to ramp down the channel potential will become negative. Therefore, the pre-charging will start from a negative voltage. In some circumstances, the pre-charge will clear out the electrons in the channel and raise the potential of the channel to a positive voltage (e.g., 1-1.3_v_). However, in sub-block mode, when trying to program memory cells of a higher sub-block, if memory in a lower sub-block as already been programmed then the memory cells of the lower sub-block may be cut off, resulting in a program disturb. For example, if the memory is in sub-block mode such that Sub-block 0 has already been programmed when trying to program memory cells in Sub-Block 1, then a memory cell of Sub-Block 0 (an example of which is indicated by box 1512 in FIG. 15) in a high data state (e.g. data state S7in the example of FIG. 9) may not turn on in response to VCHPCH applied to UCG and CG; thereby, keeping the channel cut off and maintaining the channel at the negative voltage during an attempted pre-charge, If the boosting of step 1106 starts with the channel at a negative potential, then the boosting may not get the potential of the channel high enough to avoid a program disturb to memory cells of the unselected NAND strings that are connected to the selected data word line (CG). As an example, disturbed memory cells may have their threshold voltage increased, resulting in an error in the data being stored.

Figure 17:
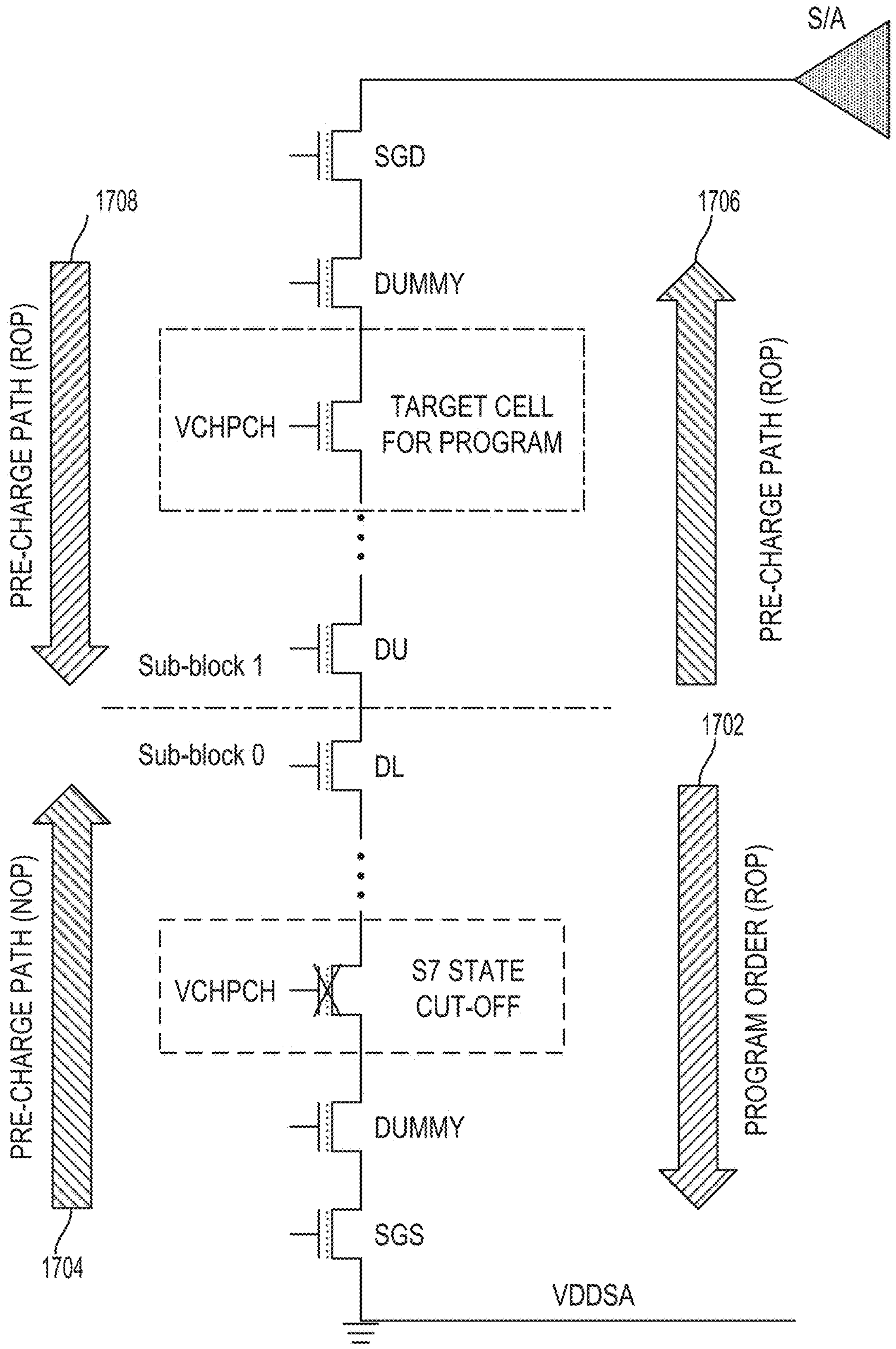
FIG. 17 is a schematic view of an example NAND string during another type of pre-charge operation.

FIG. 17 depicts a NAND string being pre-charged as part of a process to inhibit the NAND string from programming during a programming process. In the example of FIG. 17, the order of programming Sub-Block 0 is from the drain side to the source side (e.g., ROP as shown by arrow 1702) and the source of pre-charging when programming memory cells of Sub-Block 0 is from the source line (e.g., NOP as shown by arrow 1704). The order of programming Sub-Block 1 is from the source side to the drain side (e.g., NOP as shown by arrow 1706) and the source of pre-charging when programming memory cells of Sub-Block 1 is from the bit line (e.g., ROP as shown by arrow 1708). When the structure of FIG. 17 transitions from program-verify operation to the pre-charging operation of the next program loop (see FIG. 11) by lowering the data word line voltages, the channels of unselected NAND strings may couple down to a negative voltage (as discussed above with respect to FIGS. 15 and 16). However, since Sub-Block 1 pre-charges from the bit line regardless of whether Sub-Block 0 is programmed or not, Sub-Blok 1 can pre-charge and the potential of the channel can be raised to approximately 1-1.3 volts prior to the boosting. Similarly, because Sub-block 0 pre-charges from the source line, then regardless of whether Sub-Block 1 is programmed or not, Sub-Block 0 can pre-charge and the potential of the channel can be raised to approximately 1-1.3 volt prior to the boosting. This scheme of pre-charge paths and order of programming may solve the problem of channels of unselected NAND strings being coupled down to a negative voltage and undermining subsequent boosting (which can lead to a program disturb). However, the programming of Sub-Block 1 from the source side to the drain side (e.g., NOP as shown in FIG. 17) may be imperfect because NOP leads to less margins in the threshold voltages than ROP, due to larger interference from neighboring data word lines resulting from NOP. Thus, a sub-block programmed using NOP will appear to perform worse than a sub-block programmed using ROP due to the lower margins resulting from NOP. Additionally, the structure of FIG. 11 may be applicable only to a two tier architecture, and this approach may not work for a three tier architecture, as will be described below.

Figure 18:
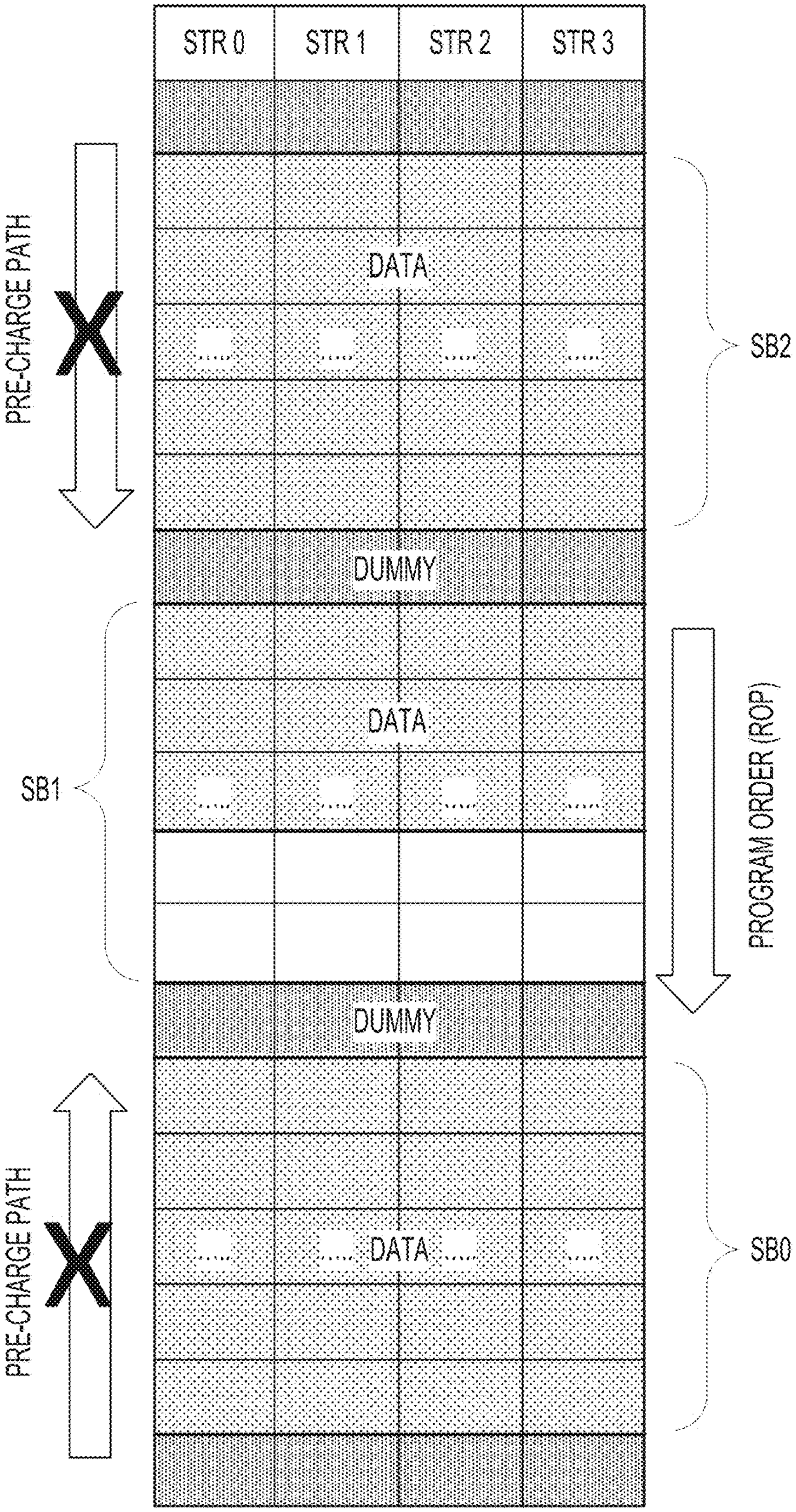
FIG. 18 is a schematic view of example NAND strings in during the pre-charge operation of FIG. 17 that have experienced program disturb.

FIG. 18 depicts multiple NAND strings (e.g., strings Str0, Str1, Str2, and Str3) being pre-charged as part of a process to inhibit the NAND strings from programming during a programming process. The NAND strings of FIG. 18 are part of a three tier architecture. It is possible that when programming Sub-block 0, the order of programming is drain side to source side (e.g., ROP) and the pre-charging is from the source line (e.g., NOP), as described above with respect to FIG. 16, such that programming Sub-block 0 will not have the problem of channels of unselected NAND strings being coupled down to a negative voltage prior to boosting as described above.

It is also possible that when programming Sub-block 2, the order of programming is source side to drain side (e.g., NOP) and the pre-charging is from the bit line (e.g., ROP), as described above for Sub-block 1 of FIG. 16, such that programming Sub-block 2 will not have the problem of channels of unselected NAND strings being coupled down to a negative voltage prior to boosting as described above, However, when programming Sub-block 1 (the middle sub-block) of FIG. 18, if Sub-block 0 is already programmed then the channels of Sub-block 1 will not be able to be pre-charged from the source line and if Sub-block 2 is already programmed then the channels of Sub-block 1 will not be able to be pre-charged from the bit line; therefore, Sub-block 1 may not have access to a source of pre-charging. Without proper pre-charging, the boosting of channels of unselected memory cells may not be successful in preventing a program disturb for the reasons discussed above regarding the NAND channel being at a negative voltage after the previous program-verify operation.

Figure 19:
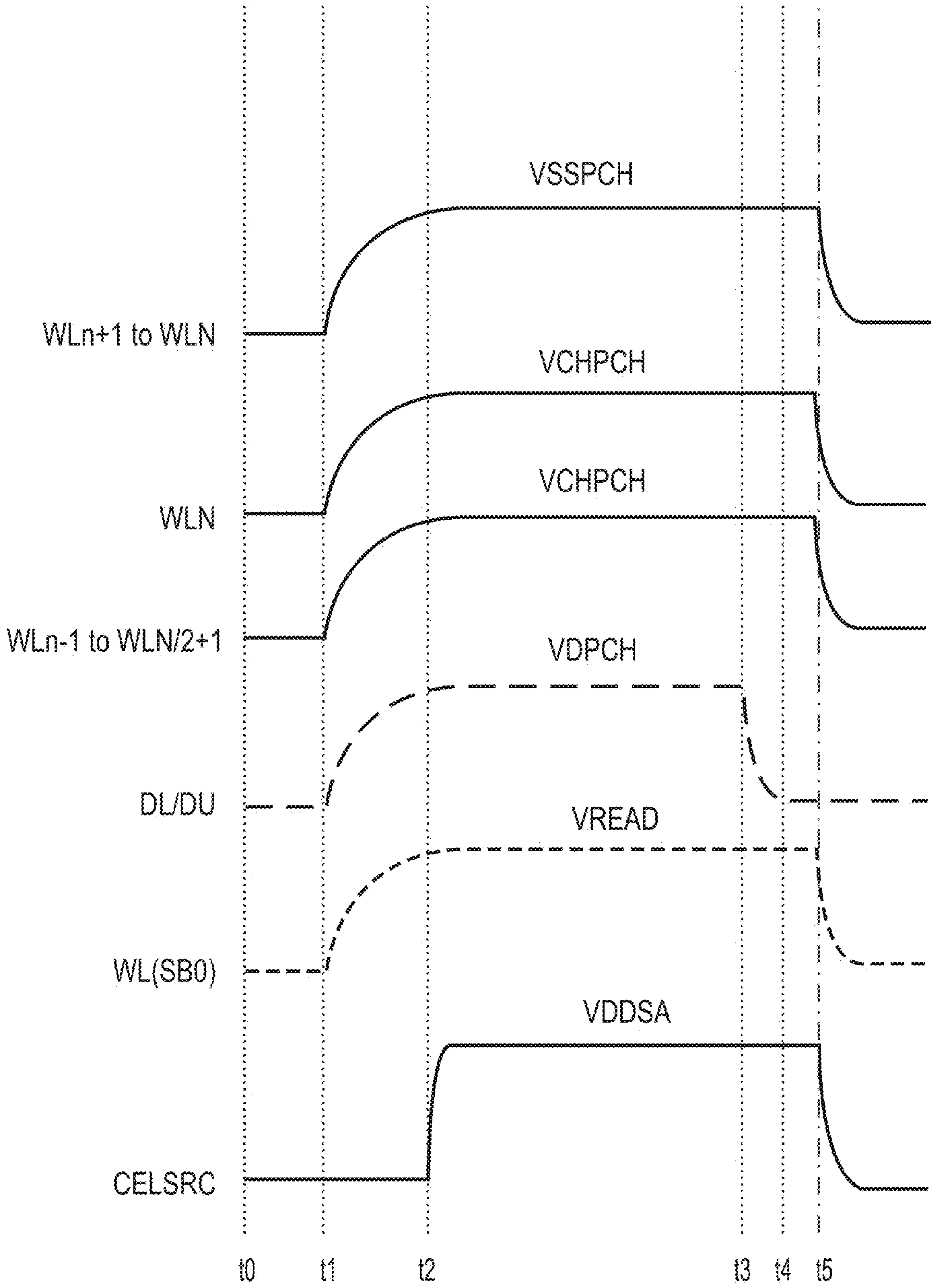
FIG. 19 illustrates voltage waveforms applied to various components of a memory block during a pre-charge operation.

To overcome the issue of the NAND channel being at a negative voltage after the previous program-verify operation, a pre-charge process was proposed that clears out the electrons in the channel and raises the potential of the channel to a positive voltage (e.g., approximately 1-1,3v) so that the boosting can prevent a program disturb to unselected memory cells during a programming operation. FIG. 19 depicts a signal diagram of the proposed pre-charging, which is performed by applying voltages that are appropriate for pre-charging to data word lines of on sub-block and dummy word lines, as well as applying overdrive voltages to another set of data word lines of another sub-block connected to already programmed memory cells. At the end of the pre-charging, the dummy word lines are ramped down to ground or a resting voltage prior to lowering the data word lines.

Figure 12:
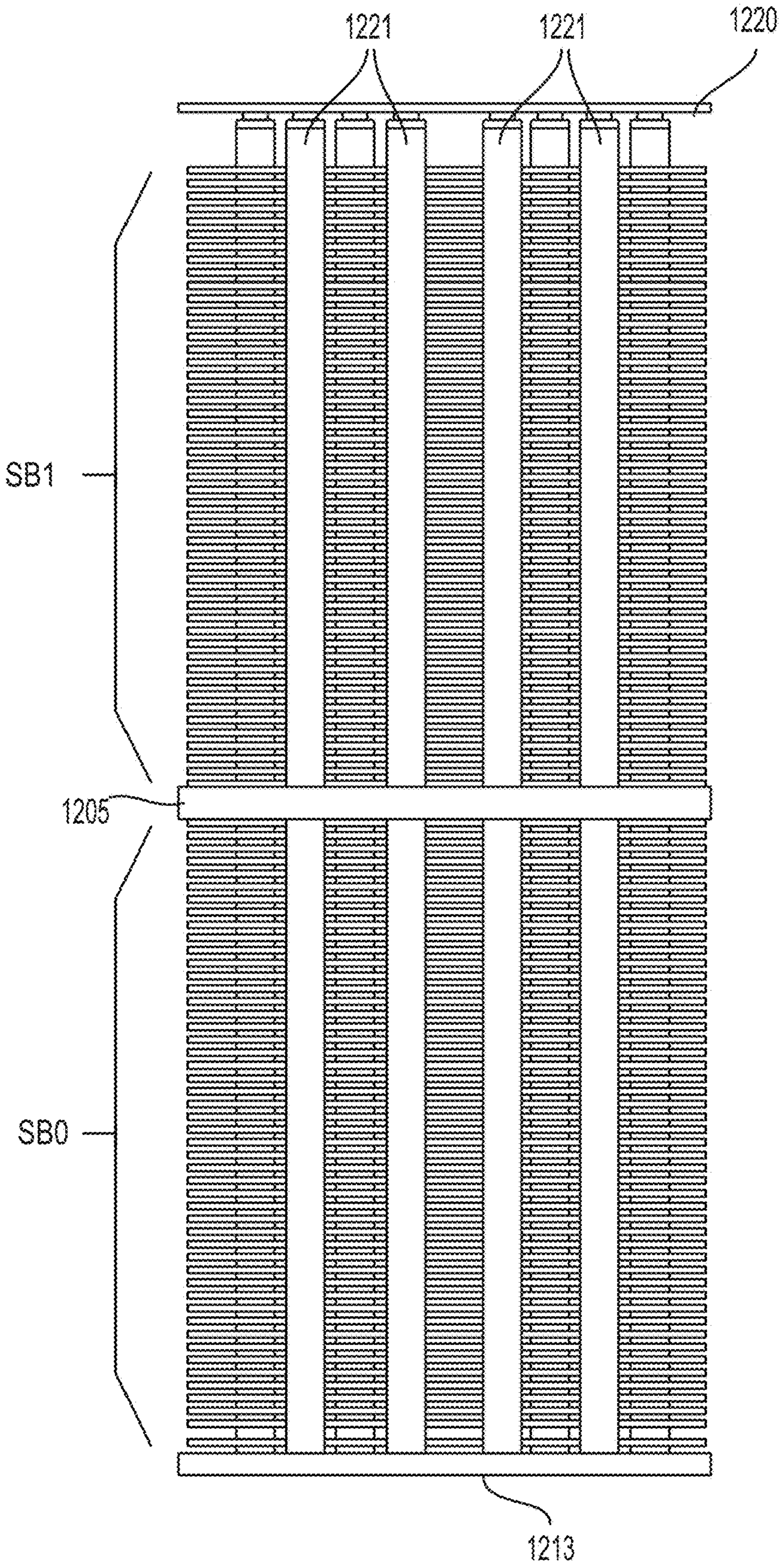
FIG. 12 is a schematic view and an example memory block that includes two sub-blocks.

FIG. 19 depicts the following signals: WLn+1−WLN, WLn, WLN/2+1 to WLn−1, DL/DU, WL(SB0), and CELSRC. CELSRC is the voltage applied to the source line SL. WLn is the voltage on the data word line selected for programming, meaning that WLn is connected to the memory cells selected for programming. DU/DL is the voltage on the dummy word lines. WLn+1 to WLN is the voltage on the unselected data word lines on the bit line side of the selected data word line. In the case of the examples described above in connection with FIGS. 6B and 12, WLN may be WL111 (e.g., 112 data word lines WL0 to WL111); however there may be more or fewer data word lines (e.g., 162 in some examples, 270 in another example, 282 in yet another example, etc.). WLN/2+1 to WLn−1 is the voltage on the unselected data word lines on the source side of the selected data word line that are in the same sub-block (e.g., SB1) as the selected data word line and are connected to erased memory cells. Thus, in this example, SB1 comprises WLN/2+1 to WLN. WL(SB0) is the voltage on the unselected data word lines on the source side of the selected data word line that are in a different sub-block (e.g., SB0) as the selected data word line (and are, in some cases, connected to already programmed memory cells).

At time t0 of FIG. 19, which represents the start of a pre-charging operation (e.g., step 1104 of FIG. 11), all of the signals are at Vss (e.g., a resting voltage or ground). At time t1, WLn and WLn−1 to WLN/2+1 are raised to VCHPCH. Also at time t1, WL(SB0) is raised to Vread in order to open the channel and force the memory cells of SB0 to turn on and conduct current regardless of the data state they are programmed to so that channel of memory cells in SB1 are able to pre-charge from the source line CELSRC to VDDSA. Additionally at time t1, DU/DL is raised to VDPCH (e.g., 3-4 volts), WLn+1-WLN are raised to VSSPCH (e.g., a very small positive voltage close to Vss) and SGS is raised to Vsg (e.g., ~3.5-6v). At time t2, CELSRC is raised to VDDSA (e.g., 2.2 volts). Between t2 and t3, the channels of unselected NAND strings are pre-charged to approximately 1.3 volts. At time t3, which is prior to lowering the data word lines, the dummy word lines DU/DL are lowered to a resting voltage of Vss (e.g., ground or appropriate resting voltage). Lowering the dummy word lines to the resting voltage cuts off the channel of SB0 from the channel of SB1 and locks the VDDSA in the channel of SB1. At time t4, the dummy word lines DU/DL have settled at the resting voltage. At time t5, which represents the end of the pre-charge operation, the data word lines (WLn+1-WLN, WLn, WLN/2+1 to WLn−1, and WL(SB0)) and CELSRC are all lowered to the resting voltage.

The time period between t4 and t5 may be a customizable delay between lowering the dummy word lines and lowering the data word lines. For example, three bits (OS[2], OS[1] and OS[0]) can be used to set one of eight delay times between 0-9.8 usec. In other examples, more or less than three bits can be used to set the customizable delay.

However, the approach depicted in FIG. 19 may result in unnecessary delay in starting a programming operation following a pre-charge operation. This is because boosting of channels of selected data word lines that are inhibited from programming (e.g., operation 1106 of FIG. 11) and programming of the selected data word line (e.g., operation 1108 of FIG. 11) cannot be initiated until after the data word lines and dummy word lines are lowered to a resting voltage or ground. That is, as shown in FIG. 19, boosting and programming are delayed until time 15 (e.g., end of the pre-charge operation), at which point the dummy word lines (DU/DL), data word lines (WLn+1-WLN, WLn, WLN/2+1 to WLn−1, and WL(SB0)) and CELSRC are all at the resting voltage. The amount of delay may be dependent on the customizable delay, but even with a customizable delay off 0 μsec, there remains a time penalty for lowering the voltages to the resting voltage. For example, if data word lines take 1 usec to ramp down, in the example of FIG. 19, the time penalty would be an extra 1 μsec due to the two step ramping down (e.g., a first ramping down step for lowering the dummy word lines and a second ramping down step for lowering the data word lines). Thus, programming may be delayed due to pre-charging operations in some situations.

An aspect of the present disclosure is related to integrating a pre-charging into a program-verify operation to take advantage of the corresponding voltage levels. In examples, during a program-verify operation, one or more voltages are applied to data word lines and one or more dummy word lines to open a channel and sense whether a memory cell connected to a selected data word line has successfully reached a target threshold voltage. At the end of the program-verify operation, a pre-charge voltage is applied to a source side of the data word lines and the one or more voltages applied to the data word lines and the one or more dummy word lines are lowered to a resting voltage (or ground). The one or more voltages applied to the one or more dummy word lines are ramped down after ramping down the one or more voltages applied to a first set of the data word lines on a drain side of the one or more dummy word lines, and prior to lowering the one or more voltages applied to a second set of the data word lines on a source side of the one or more dummy word lines. After the one or more voltages applied to the second set of the data word lines are ramped down during the program-verify operation, a boosting and/or programming operation can be initiated.

Figure 20:
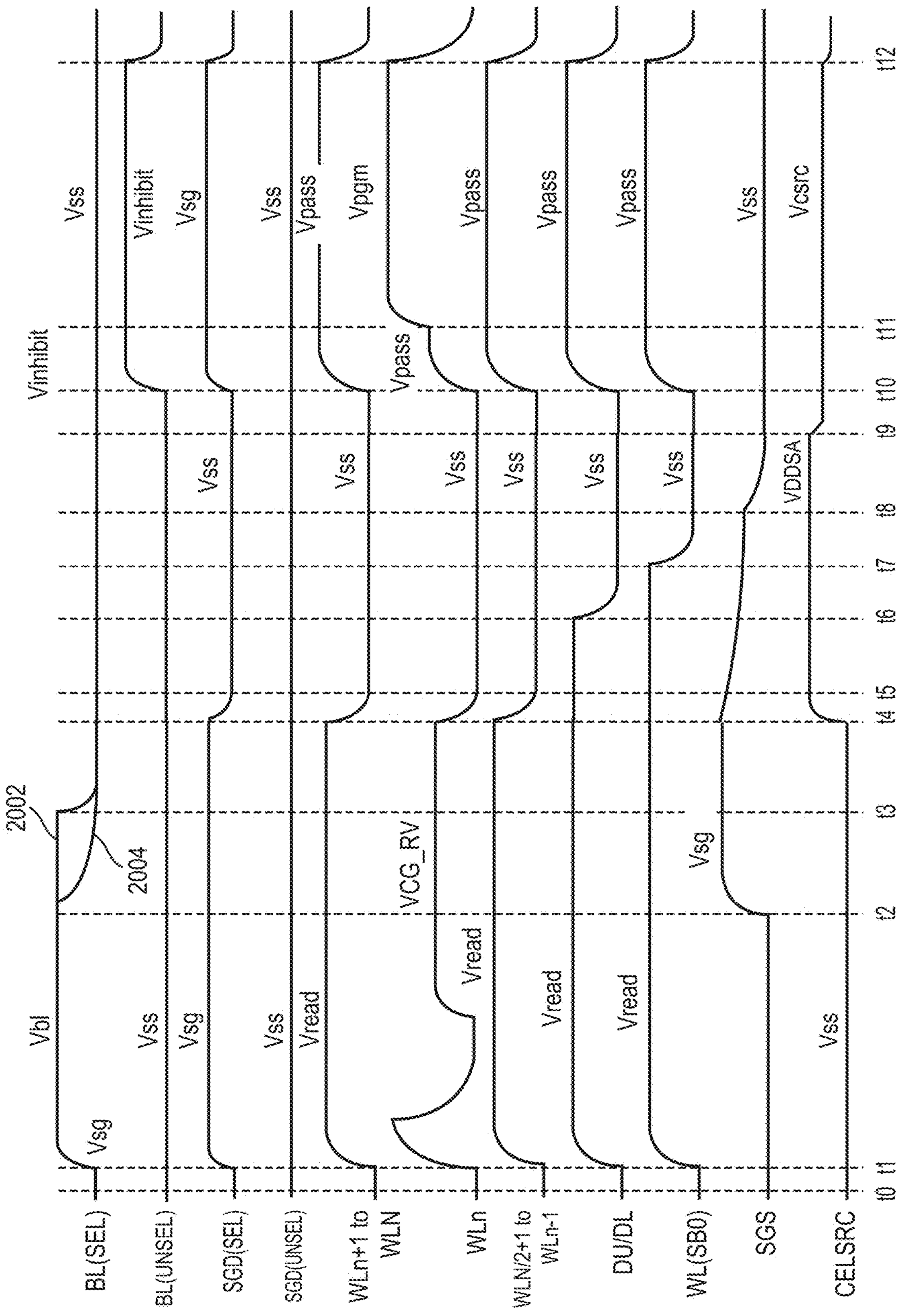
FIG. 20 illustrates the voltage waveforms applied to various components of a memory block during a program loop that includes pre-charge during a program-verify operation.

FIG. 20 illustrates voltages applied various components of a memory block before and during an exemplary embodiment of a program loop that pre-charges channels of unselected memory cells during a program verify operation of the program loop. FIG. 17 will be described with reference to a two tier architecture comprising two sub-blocks: Sub-Block 1 and Sub-Block 0 (e.g., as described in connection with FIGS. 12, 15, and 17). However, the examples disclosed herein can be extended to architectures having more than two tiers, such as a three tier architecture (e.g., FIG. 18) and four or more tier architectures.

FIG. 20 depicts the following signals: BL(sel), BL(unsel), SGD(sel), SGD(unsel), WL(SB0), DU/DL, WLN/2+1 to WLn−1, WLn, WLn+1 to WLN, SGS and CELSRC. BL(sel) is the voltage applied to bit lines connected to NAND strings having memory cells selected for programming. BL(unsel) is the voltage applied to bit lines connected to NAND strings that do not have any memory cells selected for programming. SGD(sel) is the voltage applied to the drain side select (SGD) line(s) for the region (e.g., regions WL0*a*, WL0*b*, WL0*c* and WL0*d* described above in connection with FIG. 7A) selected for programming. SGD(unsel) is the voltage applied to the SGD line(s) for the region not selected for programming. SGS is the voltage applied to the source side select (SGS) line(s). CELSRC is the voltage applied to the source line SL. WLn is the voltage on the data word line selected for programming, meaning that WLn is connected to the memory cells selected for programming. WL(SB0) are the data word lines of sub-block SB0 (e.g., WL0-WN/2 where N is the number of data lines). DU/DL is the voltage one the one or more dummy word lines between sub-block SB0 and sub-block SB1. WLN/2+1 to WLn−1 is the voltage on the unselected data word lines on the source side of the selected data word line that are in the same sub-block (e.g., SB1) as the selected data word line and are connected to erased memory cells. N may represent a counter for the number of data word lines in the memory block (e.g., 112, 162, 270, 282, etc.). In this example, SB1 comprises WLN/2+1 to WLN, where memory cells connected to WLN/2+1 to WLn−1 are erased and memory cells connected to WLn+1 to WLN are programmed. WL(SB0) is the voltage on the unselected data word lines on the source side of the selected data word line that are in a different sub-block (e.g., SB0) as the selected data word line (and are, in some cases, connected to already programmed memory cells). In this example, WL(SB0) comprises WL0 to WLN/2.

The time period of t1-t9 of FIG. 20 corresponds to a program-verify operation (e.g., step 1110 of FIG. 11) during program loop M of the program loops of steps 1104-1126. The time period of t4-t9 corresponds to a transition to the next program pulse (e.g., step 1306 of FIG. 13). The time period of t4-19 also corresponds to channel pre-charge operation during loop M of the program loops of steps 1104-1126. The pre-charge operation may be similar to the pre-charge described at step 1104 of FIG. 11, except that the pre-charge operation is performed during a program-verify operation t1-t9 during the transition to the next program pulse. The time period of t9-t12 corresponds to boosting channels of unselected NAND strings (see step 1106 of FIG. 11) and applying a program voltage pulse to the selected data word line and selected memory cells (see step 1108 of FIG. 11) during loop M of the program loops of steps 1104-1126.

At time t0, all signals depicted in FIG. 20 are at resting voltage of Vss (e.g., ground, 0 volts, or another appropriate resting voltage). At time t1, BL(sel) is raised to Vbl (e.g., 0.5-1.5 volts), SGD(sel) is raised to Vsg (e.g., 4-6 volts), WL(SB0) is raised to Vread (e.g., 7-10 volts), DU/DL is raised to Vread, WLN/2+1 to WLn−1 is raised to Vread, and WLn+1 to WLN is raised to Vread. Also, at t1, a voltage spike is applied to WLn and, subsequent to the voltage on WLn settling down, WLn is raised to VCG_RV (which can be any of the verify compare voltages such as, for example, Vv1, Vv2, Vv3, Vv4, Vv5, Vv6, and Vv7 in the example of FIG. 9). At time t2, SGS is raised to Vsg, which provides a path for the bit line voltage to dissipate. Between t2 and t3 the sense amplifiers will sense (see step 1304) whether the selected memory cells conducted in response to VCG_RV applied to WLn. If VCG_RV is greater than the threshold voltage of the selected memory cell, then a selected memory cell will conduct current and the bit line voltage will dissipate via the source line, as depicted by curve 2004. If VCG_RV is not greater than the threshold voltage of the selected memory cell, then the selected memory cell will not conduct current and the bit line voltage will not dissipate via the source line, as depicted by curve 2002. During the time period of t0-t9 BL(unsel) is at Vss. During the time period of t0-t4, CELSRC is at Vss. SGD(unsel) is at Vss during the entire period depicted in FIG. 20.

At time period between t3 and t4, which represents the start of a pre-charging operation (e.g., step 1104 of FIG. 11), the channel of memory cells in SB1 is open. For example, the program-verify operation is essentially a read operation performed for the memory cell connected to the selected data word line WLn, as detailed above. When performing a read operation the channel of memory cells in SB1 should be conductive. Thus, the voltages applied to unselected data word lines are high to ensure that the channel is conductive (e.g., open). As such, between t3 and t4, WLn is at VCG_RV and voltages applied to the other word lines (e.g., WL(SB0), WLn and WLn−1 to WLN/2+1, and DU/DL) are at an overdrive voltage (or Vread). This condition opens the channel and forces the memory cells of SB0 to turn on and conduct current regardless of the data state they are programmed to so that channel of memory cells in SB1 are able to pre-charge from the source line CELSRC to VDDSA.

During the time period of t4-t9, the system pre-charges the channels of unselected memory cells while lowering voltages at the end of program-verify operation. At t4 pre-charging can be initiated and pre-charging can occur at t5. At t4, SGD(sel) and voltages applied to the data word lines of the SB1 (i.e., WLn+1 to WLN, WLn, and WLN/2+1 to WLn−1) are lowered to one or more resting voltages (e.g., Vss, ground, or other appropriate resting voltages). The data word lines of the SB1 (i.e., WLn+1 to WLN, WLn, and WLN/2+1 to WLn−1) may be an example of the first set of data word lines on a drain side of the dummy word line. Also at t4, SGS is slowly lowered from Vsg to an intermediate voltage (reaching the intermediate voltage at t8). The intermediate voltage is greater than the threshold voltages of the selected gates connected to SGS. The source line CELSRC is raised to VDDSA (e.g., a pre-charging voltage of approximately 2-2.5 volts or a different voltage in other embodiments). Maintaining SGS above the intermediate voltage during t4-t9 can provide the channels of the unselected NAND strings (i.e., the channels of the unselected memory cells connected to the selected data word line and in the selected sub-block) with access to the pre-charging voltage VDDSA on the source line so that those channels are pre-charged to the pre-charging voltage VDDSA (or a voltage magnitude slightly less than VDDSA). That is, maintaining SGS above the intermediate voltage provides unselected memory cells of SB1 (e.g., memory cells connected to data word lines WLn+1 to WLN and WLN/2+1 to WLn−1) access to the pre-charging voltage VDDSA. For example, the channels can be pre-charged to approximately 1.3 volts when VDDSA is 2 volts.

At t5, all the voltages applied to SGD(sel) and data word lines of SB1 are ramped down to the resting voltage and pre-charging of the unselected NAND strings (i.e., the channels of the unselected memory cells connected to the selected data word line and in the selected sub-block) occurs. Between t5 and t6, the channels of unselected NAND strings are pre-charged, for example, to approximately 1.3 volts when VDDSA is 2 volts. At time t6, which may represent the conclusion of the pre-charging, the dummy word lines DU/DL are lowered to a resting voltage of Vss. Lowering the dummy word lines DU/DL to the resting voltage cuts off the channel of SB0 from the channel of SB1 and locks the pre-charging voltage VDDSA in the channel of SB1. At time t7, after the dummy word lines DU/DL have settled at the resting voltage, the data word lines WL(SB0) are lowered to Vss. The data word lines WL(SB0) may be an example of the second set of data word lines on a source side of the dummy word lines. By maintaining SGS above the intermediate voltage and keeping the channel of SB 1 open during the time period t4, the unselected memory cells of SB1 (e.g., memory cells connected to data word lines WLn+1 to WLN and WLN/2+1 to WLn−1) are provided access to the pre-charging voltage VDDSA.

Once the unselected memory cells of SB1 are charged, the channel can be closed at t6, which cuts off the channel of SB0 from that of SB1, thereby locking in the pre-charge voltage the channel of SB1. At t7, the memory cells connected to data word lines WL(SB0) may need to be prepared for the next operation-boosting (step 1106 of FIG. 11) and/or programming (step 1108 of FIG. 11)—and, as such, are lowered to Vss. At t8, SGS is lowered to Vss, and at t9 CELSRC is lowered to Vcsrc (e.g., approximately 1.5-2.23 volts or other voltage).

Note that some embodiments may break up the source line to multiple source lines and, therefore, the NAND strings and memory cells would be connected to one or more source lines (one or more other types of control lines). Further note that although example voltage magnitudes are provided herein, the technology described herein is not limited to these voltage magnitudes and other voltage magnitudes can also be used that are suitable for the particular implementation.

At time t9, the system begins a program operation by boosting of channels of selected data word lines that are inhibited from programming (e.g., operation 1106 of FIG. 11) and applying a program voltage pulse (e.g., operation 1108 of FIG. 11). At t10, the selected bit lines BL(sel) remain at Vss, while unselected bit lines BL(unsel) are raised to an inhibit voltage Vinhibit (e.g., approximately 2.5 volts). Also at t10, SGD(sel) is raised to Vsg and WL(SB0), DU/DL, WLn+1 to WLN, WLn, and WLN/2+1 to WLn−1 are all raised to Vpass (e.g., 7-10 volts). At time t11, WLn is raised from Vpass to Vpgm. The signal applied to WLn from t10 to t11 is an example of the voltage program pulse of step 1108 of FIG. 11. Applying Vpass to WL(SB0), DU/DL, WLn+1 to WLN, WLn, and WLN/2+1 to WLn−1 is an example of the boosting of step 1106 of FIG. 11. Thus, a memory cells connected to BL(sel) will be programmed in response to the application of doses of programming (e.g., program voltage pulses) while memory cells connected to BL(unsel) will be inhibited from programming due to the boosting of channels. At time t12, all of the signals that are not already at Vss are lowered to Vss.

The time period between t4 and t6 may be a customizable delay between lowering the data word lines of SB1 and lowering the dummy word lines. In examples, the delay may be at least the amount of time needed to ramp down the data word lines to the resting voltage of Vss plus an amount of time needed to reset the voltage applied to the dummy word line. In some examples, the delay may be 5 usec. In other examples, more or less than three bits can be used to set the customizable delay.

By integrating pre-charging into the program-verify operation, as set forth above, the program speed penalty can be reduced, if not eliminated. That is, for example, the unnecessary delay in starting the programming operation following a pre-charge operation, described above in connection with FIG. 19, can be eliminated by leveraging the overdrive voltages applied to the data word lines during the program-verify operation to provide for pre-charging the channel of the unselected memory cells connected to the selected data word line and in the selected sub-block. Thus, boosting and program operations can be performed nearly immediately following a program-verify operation, without requiring a separate pre-charge operation.

Additionally, by utilizing the above pre-charging scheme of FIG. 20, an all ROP pre-charge scheme can be implemented. By using an all ROP scheme, examples disclosed herein can avoid the imperfect programming (e.g., less margins) of an NOP scheme, as described above in connection with FIG. 17.

While the foregoing example is provided with reference to a two tier architecture, the scope of the present disclosure is not limited to only this example. The pre-charging scheme of FIG. 20 can be utilized in architectures of more than two tier. For example, in a three tier system, if the selected data word line is part of SB2, then the scheme can be applied to the joint between SB1 and SB2. That is, for example, SB0 may include DOL and DOU, SB1 may include DIU and DIL, and SB2 may include D2L and D2U, where the joint between SB0 and SB1 comprises DOU and DIL and the joint between SB1 and SB2 comprises DIU and D2L. In this case, where WLn is part of SB2, DIU/D2L may be lowered after ramping down data word lines of SB2 and prior to lower the data word lines of SB1 and SB0. If, however, WLn is part of SB1, then DOU/DIL may be lowered after ramping down data word lines of SB2, SB1, and DIU/D2L, and prior to lower the data word lines of SB0.

Figure 21:
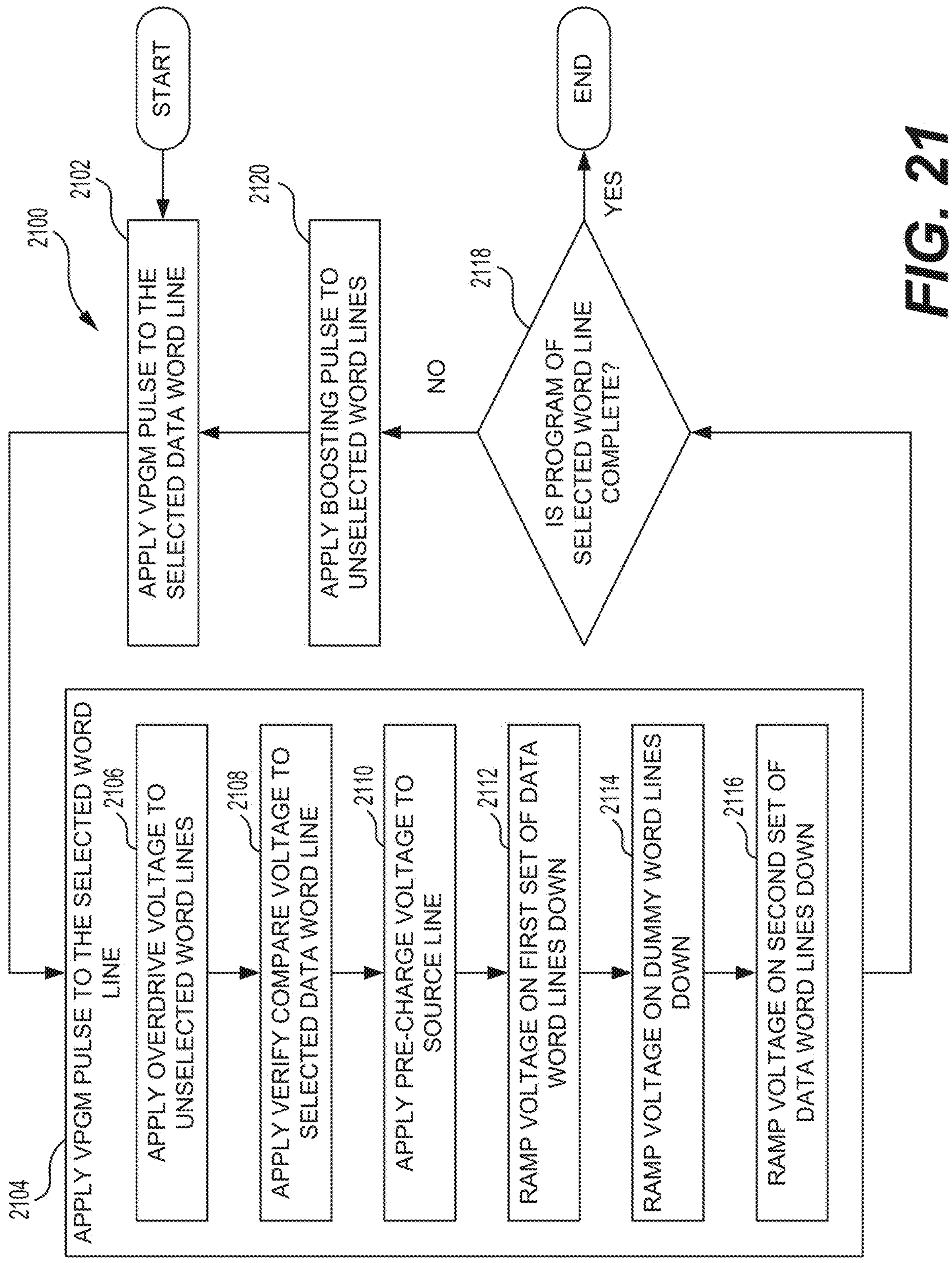
FIG. 21 is a flow chart depicting the steps of programming the memory cells of a selected data word line according to an example embodiment of the present disclosure.

FIG. 21 is a flow chart 2100 that depicts examples steps of programming the memory cells of a selected word line WLn to multiple bits per memory cell in a plurality of program loops. These steps could be performed by the controller, a processor or processing device or any other circuitry, executing instructions stored in memory, and/or other circuitry described herein that is specifically configured/programmed to execute the following steps. For example, control circuitry 110, controller 122, and/or control circuit 150 may be utilized to perform the steps of flow chart 2100.

At step 2102, a VPGM pulse is applied to a selected data word line WLn to program one or more non-inhibited memory cells connected to the selected word line. At step 2104, a program-verify operation is performed. The program-verify operation may include one or more verify pulses to check if the threshold voltages Vth of the memory cells connected to the selected data word line WLn exceed the verify voltages associated with the intended data states of those memory cells.

The program-verify operation also includes a pre-charge operation integrated with and performed during step 2104. For example, at step 2106, an overdrive voltage (e.g., Vread) is applied to unselected word lines of a memory block. As described above, the memory block can be divided into sub-blocks, each comprising a set of data word lines connected to memory cells. A joint can be provided between adjacent sub-blocks and each joint comprises one or more dummy word lines. In examples, each sub-block comprises one or more dummy lines connected to dummy memory cells, such as an upper and lower dummy line (e.g., DU and DL). Thus, each joint may comprise an upper dummy word line of a lower sub-block and a lower dummy word line of an upper sub-block. Step 2106 may include applying an overdrive voltage to unselected data word lines and the one or more dummy word lines of the memory block.

At step 2108, a verify compare voltage (e.g., VCG_RV) is applied to the selected data word line. The verify compare voltage may be an example of a verify pulses that is used to check if the threshold voltages Vth of the memory cells connected to the selected data word line WLn exceed the threshold voltages associated with the intended data states of those memory cells. Additional details on this check is provided above, for example, in connection with FIGS. 8-11, 13, and 20.

At step 2110, a pre-charge voltage (e.g., VDDSA) is applied to a source line on the source side of the memory block. Since the unselected word lines are at an overdrive voltage and the selected word line is at the verify compare voltage, the channel of memory cells (connected to the selected or unselected word lines) can access the pre-charge voltage.

At step 2112, the voltage applied to a first set of data word lines on the drain side of the dummy word lines is ramped down to a resting voltage to cut off the channel of memory cells connected to data word lines on the drain side of the dummy word lines. The first set of data word lines comprises the selected data word line and unselected data word lines on the drain side of the dummy word line. In some examples, the first set of data word lines comprises data word lines of a sub-block corresponding to the selected data word line.

At step 2114, the voltage applied to the dummy word lines is lowered to the resting voltage after step 211. Step 2114 functions to cut off the channel connected to the first set of data word lines from the pre-charge voltage thereby locking the pre-charge voltage in the channel. In an example, step 2112 closes the channel of the sub-block corresponding to the selected data word line, thereby locking the pre-charge voltage in the channel of the unselected data word lines of this sub-block. By locking in the pre-charge voltage at step 2114, the channel of the unselected data word lines can be pre-charged.

Subsequently, at step 2116, the voltage applied to a second set of data word lines on the source side of the dummy word lines is lowered to a resting voltage. The second set of data word lines comprises the data word lines of a sub-block on a source side of the sub-block corresponding to the selected data word line (e.g., a lower sub-block).

After the program-verify operation and included pre-charge is completed, a bitscan operation may be performed to compare a number of failed bits for each data state being verified to a bit scan pass fail (BSPF) threshold. If the number of failed bits is less than the BSPF threshold, then programming to that data state is considered to be completed.

At decision step 2118, it is determined if programming of the selected word line WLn is completed, i.e., has programming to all data states been completed. If the answer at decision step 2118 is "yes," then the programming operation is completed.

If the answer at decision step 2118 is "no," then the process then continues through a plurality of program loops until either programming is completed or fails. For example, the next program loop may be initiated at step 2120 by applying a boosting voltage to unselected word lines to inhibit programming of memory cells connected to unselected word lines for the next program loop and the process returns to step 2102 for the next selected data word line.

Each of the processes, methods, and flow charts described in the preceding sections may be embodied in, and fully or partially automated by, code components executed by one or more controllers or memory devices. The methods, processes, and flow charts described herein are also not limited to any particular sequence, and the blocks or steps relating thereto can be performed in other sequences that are appropriate, or may be performed in parallel, or in some other manner. Blocks or steps may be added to or removed from the disclosed examples. For example, the various features and processes described in the various embodiments disclosed above may be used independently of one another, or may be combined in various ways. The disclosed processes, methods, and flow charts may thusly have steps or blocks added to or removed therefrom due to combining the various examples disclosed above.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein.

Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. By way of example, "a processor" programmed to perform various functions refers to one processor programmed to perform each and every function or more than one processor collectively programmed to perform each of the various functions. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of pre-charging a memory device, comprising steps of:

preparing a memory block that includes a plurality of memory cells that are connected to a plurality of data word lines and in a plurality of channels, wherein the plurality of word lines comprises a first set of data word lines and a second set of data word lines separated by one or more dummy word lines;

performing a program-verify operation to verify programming of one or more memory cells connected to a selected data word line of the first set of data word lines, wherein performing the program-verify operation includes a step of applying an overdrive voltage to the second set of data word lines and the one or more dummy word lines; and during the program-verify operation, pre-charging a channel of memory cells connected to unselected data word line of the first set of data word lines, wherein pre-charging the channel includes steps of:

applying a pre-charge voltage to a source line of the memory block; and ramping down the overdrive voltage applied to the one or more dummy word lines to a resting voltage prior to ramping down the overdrive voltage applied to the second set of data word lines to the resting voltage.

2. The method as set forth in claim 1, wherein performing the program-verify operation further includes steps of:

applying a verify compare voltage to the first set of data word lines; and verifying the programming of one or more memory cells connected to a selected data word line based on the verify compare voltage.

3. The method as set forth in claim 2, wherein pre-charging the channel further includes steps of:

ramping down the verify compare voltage applied to the selected data word line to the resting voltage before ramping down the overdrive voltages applied to the one or more dummy word lines.

4. The method as set forth in claim 2, wherein pre-charging the channel includes further steps of:

ramping down a voltage applied to a source side selected gate (SGS) line from a source-side select gate voltage (Vsg) to an intermediate voltage, wherein Vsg is selected to turn on a transistor for the SGS, and wherein the intermediate voltage is greater than threshold voltages of the transistors connected to SGS.

5. The method as set forth in claim 4, wherein the voltage applied to a source side selected gate (SGS) line is ramped down over a time period between applying the pre-charge voltage to the source line of the memory block and ramping down the overdrive voltage applied to the second set of data word lines to the resting voltage.

6. The method as set forth in claim 1, further including the step of:

after pre-charging the channel, applying one or more of a boosting voltage to the unselected data word lines of the first set of data word lines or a programming voltage to the selected data word line.

7. The method as set forth in claim 1, wherein the overdrive voltage applied to the one or more dummy word lines is ramped down after the pre-charge voltage is applied to the source line.

8. The method as set forth in claim 1, wherein the second set of data word lines is on a source side of the one or more dummy words adjacent to the source line.

9. The method as set forth in claim 1, wherein the first set of data word lines is on a drain side of the one or more dummy words opposite the source line.

10. A memory device, comprising:

a memory block that includes a plurality of memory cells that are arranged in a plurality of word lines and in a plurality of channels, wherein the plurality of word lines comprises a first set of data word lines and a second set of data word lines separated by one or more dummy word lines; and circuitry that is configured to conduct a program-verify operation to verify programming of one or more memory cells connected to a selected data word line of the first set of data word lines, the program-verify operation including:

applying an overdrive voltage to the second set of data word lines and the one or more dummy word lines, and pre-charging a channel of memory cells connected to unselected data word line of the first set of data word lines by:

applying a pre-charge voltage to a source line of the memory block, and ramping down the overdrive voltage applied to the one or more dummy word lines to a resting voltage prior to ramping down the overdrive voltage applied to the second set of data word lines to the resting voltage.

11. The memory device as set forth in claim 10, wherein performing the program-verify operation includes:

applying a verify compare voltage to the first set of data word lines; and verifying the programming of one or more memory cells connected to a selected data word line based on the verify compare voltage.

12. The memory device as set forth in claim 10, wherein pre-charging the channel includes:

applying a verify compare voltage to the first set of data word lines; and verifying the programming of one or more memory cells connected to a selected data word line based on the verify compare voltage.

13. The memory device as set forth in claim 12, wherein pre-charging the channel further includes:

ramping down the verify compare voltage applied to the selected data word line to the resting voltage before ramping down the overdrive voltages applied to the one or more dummy word lines.

14. The memory device as set forth in claim 10, wherein the circuitry is further configured to:

after pre-charging the channel, apply one or more of a boosting voltage to the unselected data word lines of the first set of data word lines or a programming voltage to the selected data word line.

15. The memory device as set forth in claim 10, wherein the overdrive voltage applied to the one or more dummy word lines is ramped down after the pre-charge voltage is applied to the source line.

16. The memory device as set forth in claim 10, wherein the second set of data word lines is on a source side of the one or more dummy words adjacent to the source line, and wherein the first set of data word lines is on a drain side of the one or more dummy words opposite the source line.

17. An apparatus, comprising:

a memory block that includes a plurality of memory cells that are arranged in a plurality of word lines and in a plurality of channels, wherein the plurality of word lines comprises a first set of data word lines and a second set of data word lines separated by one or more dummy word lines;

a controller that is configured to program one or more memory cells connected to a selected word line of the first set of word lines in a programming operation, the programming operation including:

in a program-verify operation:

applying an overdrive voltage to the second set of data word lines and the one or more dummy word lines, applying a pre-charge voltage to a source line of the memory block, and lowering the overdrive voltage applied to the one or more dummy word lines to a resting voltage prior to ramping down the overdrive voltage applied to the second set of data word lines to the resting voltage; and after the program-verify operation, applying one or more of a boosting voltage to unselected data word lines of the first set of data word lines or a programming voltage to the selected word line.

18. The apparatus as set forth in claim 17, wherein the programming operation further includes:

in the program-verify operation, verifying programming of the one or more memory cells connected to a selected data word line based on a verify compare voltage applied to the first set of data word lines.

19. The apparatus as set forth in claim 18, wherein the pre-charge voltage is applied to the source line after applying the verify compare voltage to the first set of data word lines and after applying the overdrive voltage to the second set of data word lines and the one or more dummy word lines.

20. The apparatus as set forth in claim 18, wherein the programming operation further includes:

in the program-verify operation, ramping down the verify compare voltage applied to the selected data word line to the resting voltage before ramping down the overdrive voltages applied to the one or more dummy word lines.

* * * * *